United States Patent
Ranta

(10) Patent No.: US 9,948,281 B2
(45) Date of Patent: Apr. 17, 2018

(54) POSITIVE LOGIC DIGITALLY TUNABLE CAPACITOR

(71) Applicant: Peregrine Semiconductor Corporation, San Diego, CA (US)

(72) Inventor: Tero Tapio Ranta, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/256,453

(22) Filed: Sep. 2, 2016

(65) Prior Publication Data

US 2018/0069530 A1    Mar. 8, 2018

(51) Int. Cl.
| | | |
|---|---|---|
| H03K 3/00 | (2006.01) | |
| H03J 3/16 | (2006.01) | |
| H03K 17/687 | (2006.01) | |

(52) U.S. Cl.
CPC .............. *H03J 3/16* (2013.01); *H03K 17/687* (2013.01)

(58) Field of Classification Search
CPC ...... H03J 3/20; H03J 2200/10; H03K 17/162; H03K 17/687; H03H 7/38; H03H 7/0153; H03H 711/28; H03M 1/1061; H03M 1/804; H01G 7/00
USPC .................................................... 327/109
See application file for complete search history.

(56) References Cited

U.S. PATENT DOCUMENTS

| | | |
|---|---|---|
| 3,646,361 A | 2/1972 | Pfiffner |
| 3,699,359 A | 10/1972 | Shelby |
| 3,975,671 A | 8/1976 | Stoll |
| 3,988,727 A | 10/1976 | Scott |
| 4,053,916 A | 10/1977 | Cricchi et al. |
| 4,244,000 A | 1/1981 | Ueda et al. |
| 4,256,977 A | 3/1981 | Hendrickson |
| 4,316,101 A | 2/1982 | Minner |
| 4,317,055 A | 2/1982 | Yoshida et al. |
| 4,367,421 A | 1/1983 | Baker |

(Continued)

FOREIGN PATENT DOCUMENTS

| | | |
|---|---|---|
| CN | 1256521 | 6/2000 |
| DE | 19932565 | 8/1999 |

(Continued)

OTHER PUBLICATIONS

Fuse, et al., "A 0.5V 200MHz 1-Stage 32b ALU Using a Body Bias Controlled SOI Pass-Gate Logic", IEEE Int'l Solid-State Circuits Conference, Feb. 1997.

(Continued)

*Primary Examiner* — Patrick Chen
(74) *Attorney, Agent, or Firm* — Jaquez Land Greenhaus LLP; Martin J. Jaquez, Esq.; Alessandro Steinfl, Esq.

(57) ABSTRACT

Methods and devices providing Positive Logic biasing schemes for use in a digitally tuning capacitor in an integrated circuit device are described. The described methods can be used in integrated circuits with stringent requirements in terms of switching time, power handling, noise sensitivity and power consumption. The described devices include DC blocking capacitors arranged in series with stacked switches coupled to RF nodes. The stacked FET switches receive non-negative supply voltages through their drains and gates during the ON and OFF states to adjust the capacitance between the two nodes.

12 Claims, 9 Drawing Sheets

(56) References Cited

U.S. PATENT DOCUMENTS

| | | |
|---|---|---|
| 4,390,798 A | 6/1983 | Kurafuji |
| RE31,749 E | 11/1984 | Yamashiro |
| 4,638,184 A | 1/1987 | Kimura |
| 4,736,169 A | 4/1988 | Weaver et al. |
| 4,739,191 A | 4/1988 | Puar |
| 4,746,960 A | 5/1988 | Valeri et al. |
| 4,748,485 A | 5/1988 | Vasudev |
| 4,809,056 A | 2/1989 | Shirato et al. |
| 4,810,911 A | 3/1989 | Noguchi |
| 4,849,651 A | 7/1989 | Estes, Jr. |
| 4,890,077 A | 12/1989 | Sun |
| 4,891,609 A | 1/1990 | Eilley |
| 4,893,070 A | 1/1990 | Milberger et al. |
| 4,906,587 A | 3/1990 | Blake |
| 4,929,855 A | 5/1990 | Ezzeddine |
| 4,939,485 A | 7/1990 | Eisenberg |
| 4,984,040 A | 1/1991 | Yap |
| 4,985,647 A | 1/1991 | Kawada |
| 5,001,528 A | 3/1991 | Bahraman |
| 5,012,123 A | 4/1991 | Ayasli et al. |
| 5,023,494 A | 6/1991 | Tsukii et al. |
| 5,061,907 A | 10/1991 | Rasmussen |
| 5,061,911 A | 10/1991 | Weidman et al. |
| 5,081,706 A | 1/1992 | Kim |
| 5,095,348 A | 3/1992 | Houston |
| 5,124,762 A | 6/1992 | Childs et al. |
| 5,146,178 A | 9/1992 | Nojima et al. |
| 5,148,393 A | 9/1992 | Furuyama |
| 5,157,279 A | 10/1992 | Lee |
| 5,182,529 A | 1/1993 | Chem |
| 5,208,557 A | 5/1993 | Kersh, III |
| 5,272,457 A | 12/1993 | Heckaman et al. |
| 5,274,343 A | 12/1993 | Russell et al. |
| 5,283,457 A | 2/1994 | Matloubian |
| 5,285,367 A | 2/1994 | Keller |
| 5,306,954 A | 4/1994 | Chan et al. |
| 5,313,083 A | 5/1994 | Schindler |
| 5,317,181 A | 5/1994 | Tyson |
| 5,345,422 A | 9/1994 | Redwine |
| 5,350,957 A | 9/1994 | Cooper et al. |
| 5,375,257 A | 12/1994 | Lampen |
| 5,405,795 A | 3/1995 | Beyer et al. |
| 5,416,043 A | 5/1995 | Burgener et al. |
| 5,442,327 A | 8/1995 | Longbrake et al. |
| 5,446,418 A | 8/1995 | Hara et al. |
| 5,448,207 A | 9/1995 | Kohama |
| 5,477,184 A | 12/1995 | Uda et al. |
| 5,488,243 A | 1/1996 | Tsuruta et al. |
| 5,492,857 A | 2/1996 | Reedy et al. |
| 5,493,249 A | 2/1996 | Manning |
| 5,548,239 A | 8/1996 | Kohama |
| 5,553,295 A | 9/1996 | Pantelakis et al. |
| 5,554,892 A | 9/1996 | Norimatsu |
| 5,559,368 A | 9/1996 | Hu et al. |
| 5,572,040 A | 11/1996 | Reedy et al. |
| 5,576,647 A | 11/1996 | Sutardja |
| 5,578,853 A | 11/1996 | Hayashi et al. |
| 5,581,106 A | 12/1996 | Hayashi et al. |
| 5,594,371 A | 1/1997 | Douseki |
| 5,596,205 A | 1/1997 | Reedy et al. |
| 5,597,739 A | 1/1997 | Sumi et al. |
| 5,600,169 A | 2/1997 | Burgener et al. |
| 5,600,588 A | 2/1997 | Kawashima |
| 5,610,533 A | 3/1997 | Arimoto et al. |
| 5,629,655 A | 5/1997 | Dent |
| 5,663,570 A | 9/1997 | Reedy et al. |
| 5,670,907 A | 9/1997 | Gorecki et al. |
| 5,681,761 A | 10/1997 | Kim |
| 5,689,144 A | 11/1997 | Williams |
| 5,694,308 A | 12/1997 | Cave |
| 5,699,018 A | 12/1997 | Yamamoto et al. |
| 5,717,356 A | 2/1998 | Kohama |
| 5,729,039 A | 3/1998 | Beyer et al. |
| 5,731,607 A | 3/1998 | Kohama |
| 5,734,291 A | 3/1998 | Tasdighi et al. |
| 5,748,016 A | 5/1998 | Kurosawa |
| 5,748,053 A | 5/1998 | Kameyama et al. |
| 5,753,955 A | 5/1998 | Fechner |
| 5,760,652 A | 6/1998 | Yamamoto et al. |
| 5,767,549 A | 6/1998 | Chen et al. |
| 5,774,411 A | 6/1998 | Hsieh et al. |
| 5,774,792 A | 6/1998 | Tanaka et al. |
| 5,784,687 A | 6/1998 | Itoh et al. |
| 5,777,530 A | 7/1998 | Nakatuka |
| 5,784,311 A | 7/1998 | Assaderaghi et al. |
| 5,793,246 A | 8/1998 | Vest et al. |
| 5,801,577 A | 9/1998 | Tailliet |
| 5,804,858 A | 9/1998 | Hsu et al. |
| 5,807,772 A | 9/1998 | Takemura |
| 5,808,505 A | 9/1998 | Tsukada |
| 5,812,939 A | 9/1998 | Kohama |
| 5,814,899 A | 9/1998 | Okumura et al. |
| 5,818,099 A | 10/1998 | Burghartz |
| 5,818,278 A | 10/1998 | Yamamoto et al. |
| 5,818,283 A | 10/1998 | Tonami et al. |
| 5,818,289 A | 10/1998 | Chevallier et al. |
| 5,818,766 A | 10/1998 | Song |
| 5,821,769 A | 10/1998 | Douseki |
| 5,821,800 A | 10/1998 | Le et al. |
| 5,825,227 A | 10/1998 | Kohama et al. |
| 5,861,336 A | 1/1999 | Reedy et al. |
| 5,863,823 A | 1/1999 | Burgener |
| 5,864,328 A | 1/1999 | Kajimoto |
| 5,874,836 A | 2/1999 | Nowak et al. |
| 5,874,849 A | 2/1999 | Marotta et al. |
| 5,877,978 A | 3/1999 | Morishita et al. |
| 5,878,331 A | 3/1999 | Yamamoto et al. |
| 5,883,396 A | 3/1999 | Reedy et al. |
| 5,883,541 A | 3/1999 | Tahara et al. |
| 5,892,260 A | 4/1999 | Okumura et al. |
| 5,892,382 A | 4/1999 | Ueda et al. |
| 5,892,400 A | 4/1999 | van Saders et al. |
| 5,895,957 A | 4/1999 | Reedy et al. |
| 5,903,178 A | 5/1999 | Miyatsuji et al. |
| 5,912,560 A | 6/1999 | Pasternak |
| 5,917,362 A | 6/1999 | Kohama |
| 5,920,233 A | 7/1999 | Denny |
| 5,926,466 A | 7/1999 | Ishida et al. |
| 5,930,605 A | 7/1999 | Mistry et al. |
| 5,930,638 A | 7/1999 | Reedy et al. |
| 5,945,867 A | 8/1999 | Uda et al. |
| 5,959,335 A | 9/1999 | Bryant et al. |
| 5,969,560 A | 10/1999 | Kohama et al. |
| 5,973,363 A | 10/1999 | Staab et al. |
| 5,973,382 A | 10/1999 | Burgener et al. |
| 5,973,636 A | 10/1999 | Okubo et al. |
| 5,986,518 A | 11/1999 | Dougherty |
| 5,990,580 A | 11/1999 | Weigand |
| 6,020,778 A | 2/2000 | Shigehara |
| 6,020,781 A | 2/2000 | Fujioka |
| 6,049,110 A | 4/2000 | Koh |
| 6,057,555 A | 5/2000 | Reedy et al. |
| 6,057,723 A | 5/2000 | Yamaji et al. |
| 6,061,267 A | 5/2000 | Houston |
| 6,064,275 A | 5/2000 | Yamauchi |
| 6,064,872 A | 5/2000 | Vice |
| 6,066,993 A | 5/2000 | Yamamoto et al. |
| 6,081,165 A | 6/2000 | Goldman |
| 6,081,694 A | 6/2000 | Matsuura et al. |
| 6,084,255 A | 7/2000 | Ueda et al. |
| 6,087,893 A | 7/2000 | Oowaki et al. |
| 6,094,088 A | 7/2000 | Yano |
| 6,100,564 A | 8/2000 | Bryant et al. |
| 6,104,061 A | 8/2000 | Forbes et al. |
| 6,111,778 A | 8/2000 | MacDonald et al. |
| 6,114,923 A | 9/2000 | Mizutani |
| 6,118,343 A | 9/2000 | Winslow |
| 6,122,185 A | 9/2000 | Utsunomiya et al. |
| 6,133,752 A | 10/2000 | Kawagoe |
| 6,160,292 A | 12/2000 | Flaker et al. |
| 6,169,444 B1 | 1/2001 | Thurber, Jr. |
| 6,172,378 B1 | 1/2001 | Hull et al. |
| 6,173,235 B1 | 1/2001 | Maeda |
| 6,177,826 B1 | 1/2001 | Mashiko et al. |

(56) References Cited

U.S. PATENT DOCUMENTS

| | | |
|---|---|---|
| 6,188,247 B1 | 2/2001 | Storino et al. |
| 6,188,590 B1 | 2/2001 | Chang et al. |
| 6,191,449 B1 | 2/2001 | Shimo |
| 6,195,307 B1 | 2/2001 | Umezawa et al. |
| 6,201,761 B1 | 3/2001 | Wollesen |
| 6,218,248 B1 | 3/2001 | Hwang et al. |
| RE37,124 E | 4/2001 | Monk et al. |
| 6,215,360 B1 | 4/2001 | Callaway, Jr. |
| 6,218,890 B1 | 4/2001 | Yamaguchi et al. |
| 6,218,892 B1 | 4/2001 | Soumyanath et al. |
| 6,222,394 B1 | 4/2001 | Allen et al. |
| 6,239,649 B1 | 5/2001 | Bertin et al. |
| 6,249,027 B1 | 6/2001 | Burr |
| 6,249,029 B1 | 6/2001 | Bryant et al. |
| 6,249,446 B1 | 6/2001 | Shearon et al. |
| 6,281,737 B1 | 8/2001 | Kuang et al. |
| 6,288,458 B1 | 9/2001 | Berndt |
| 6,297,687 B1 | 10/2001 | Sugimura |
| 6,300,796 B1 | 10/2001 | Troutman et al. |
| 6,304,110 B1 | 10/2001 | Hirano |
| 6,308,047 B1 | 10/2001 | Yamamoto et al. |
| 6,320,225 B1 | 11/2001 | Hargrove et al. |
| 6,337,594 B1 | 1/2002 | Hwang |
| 6,341,087 B1 | 1/2002 | Kunikiyo |
| 6,356,536 B1 | 3/2002 | Repke |
| 6,365,488 B1 | 4/2002 | Liao |
| 6,380,793 B1 | 4/2002 | Bancal et al. |
| 6,380,796 B2 | 4/2002 | Bancal et al. |
| 6,387,739 B1 | 5/2002 | Smith |
| 6,392,440 B2 | 5/2002 | Nebel |
| 6,392,467 B1 | 5/2002 | Oowaki et al. |
| 6,396,325 B2 | 5/2002 | Goodell |
| 6,400,211 B1 | 6/2002 | Yokomizo et al. |
| 6,407,427 B1 | 6/2002 | Oh |
| 6,407,614 B1 | 6/2002 | Takahashi |
| 6,414,863 B1 | 7/2002 | Bayer et al. |
| 6,429,487 B1 | 8/2002 | Kunikiyo |
| 6,429,632 B1 | 8/2002 | Forbes et al. |
| 6,429,723 B1 | 8/2002 | Hastings |
| 6,433,587 B1 | 8/2002 | Assaderaghi et al. |
| 6,433,589 B1 | 8/2002 | Lee |
| 6,452,232 B1 | 9/2002 | Adan |
| 6,461,902 B1 | 10/2002 | Xu et al. |
| 6,466,082 B1 | 10/2002 | Krishnan |
| 6,469,568 B2 | 10/2002 | Toyoyama et al. |
| 6,486,511 B1 | 11/2002 | Nathanson et al. |
| 6,486,729 B2 | 11/2002 | Imamiya |
| 6,498,058 B1 | 12/2002 | Bryant et al. |
| 6,498,370 B1 | 12/2002 | Kim et al. |
| 6,504,212 B1 | 1/2003 | Allen et al. |
| 6,504,213 B1 | 1/2003 | Ebina |
| 6,512,269 B1 | 1/2003 | Braynt et al. |
| 6,518,645 B2 | 2/2003 | Bae et al. |
| 6,521,959 B2 | 2/2003 | Kim et al. |
| 6,531,356 B1 | 3/2003 | Hayashi |
| 6,537,861 B1 | 3/2003 | Kroell et al. |
| 6,559,689 B1 | 5/2003 | Clark |
| 6,563,366 B1 | 5/2003 | Kohama |
| 6,608,785 B2 | 8/2003 | Chuang et al. |
| 6,608,789 B2 | 8/2003 | Sullivan et al. |
| 6,617,933 B2 | 9/2003 | Ito et al. |
| 6,631,505 B2 | 10/2003 | Arai |
| 6,632,724 B2 | 10/2003 | Henley et al. |
| 6,642,578 B1 | 11/2003 | Arnold et al. |
| 6,646,305 B2 | 11/2003 | Assaderaghi et al. |
| 6,653,697 B2 | 11/2003 | Hidaka et al. |
| 6,677,641 B2 | 1/2004 | Kocon |
| 6,677,803 B1 | 1/2004 | Chiba |
| 6,683,499 B2 | 1/2004 | Lautzenhiser et al. |
| 6,684,065 B2 | 1/2004 | Bult |
| 6,693,326 B2 | 2/2004 | Adan |
| 6,693,498 B1 | 2/2004 | Sasabata et al. |
| 6,698,082 B2 | 3/2004 | Crenshaw et al. |
| 6,698,498 B1 | 3/2004 | Crenshaw et al. |
| 6,703,863 B2 | 3/2004 | Gion |
| 6,711,397 B1 | 3/2004 | Petrov et al. |
| 6,714,065 B2 | 3/2004 | Komiya et al. |
| 6,717,458 B1 | 4/2004 | Potanin |
| 6,747,522 B2 | 6/2004 | Pietruszynski et al. |
| 6,753,738 B1 | 6/2004 | Baird |
| 6,762,477 B2 | 7/2004 | Kunikiyo |
| 6,790,747 B2 | 7/2004 | Henley et al. |
| 6,774,701 B1 | 8/2004 | Heston et al. |
| 6,781,805 B1 | 8/2004 | Urakawa |
| 6,788,130 B2 | 9/2004 | Pauletti et al. |
| 6,801,076 B1 | 10/2004 | Merritt |
| 6,803,680 B2 | 10/2004 | Brindle et al. |
| 6,804,502 B2 | 10/2004 | Burgener et al. |
| 6,816,016 B2 | 11/2004 | Sander et al. |
| 6,819,938 B2 | 11/2004 | Sahota |
| 6,830,963 B1 | 12/2004 | Forbes |
| 6,836,172 B2 | 12/2004 | Okashita |
| 6,870,241 B2 | 3/2005 | Nakatani et al. |
| 6,871,059 B1 | 3/2005 | Piro et al. |
| 6,879,502 B2 | 4/2005 | Yoshida et al. |
| 6,889,036 B2 | 5/2005 | Ballweber et al. |
| 6,891,234 B1 | 5/2005 | Connelly et al. |
| 6,897,701 B2 | 5/2005 | Chen et al. |
| 6,898,778 B2 | 5/2005 | Kawanaka |
| 6,906,653 B2 | 6/2005 | Uno |
| 6,908,832 B2 | 6/2005 | Farrens et al. |
| 6,917,258 B2 | 7/2005 | Kushitani et al. |
| 6,933,744 B2 | 8/2005 | Das et al. |
| 6,947,720 B2 | 9/2005 | Razavi et al. |
| 6,969,668 B1 | 11/2005 | Kang et al. |
| 6,975,271 B2 | 12/2005 | Adachi et al. |
| 6,978,122 B2 | 12/2005 | Kawakyu et al. |
| 6,978,437 B1 | 12/2005 | Rittman et al. |
| 6,992,543 B2 | 1/2006 | Luetzelschwab et al. |
| 7,023,260 B2 | 4/2006 | Thorp et al. |
| 7,042,245 B2 | 5/2006 | Hidaka |
| 7,045,873 B2 | 5/2006 | Chen et al. |
| 7,056,808 B2 | 6/2006 | Henley et al. |
| 7,057,472 B2 | 6/2006 | Kukamachi et al. |
| 7,058,922 B2 | 6/2006 | Kawanaka |
| 7,082,293 B1 | 7/2006 | Rofougaran et al. |
| 7,092,677 B1 | 8/2006 | Zhang et al. |
| 7,109,532 B1 | 9/2006 | Lee et al. |
| 7,123,898 B2 | 10/2006 | Burgener et al. |
| 7,129,545 B2 | 10/2006 | Cain |
| 7,132,873 B2 | 11/2006 | Hollmer |
| 7,138,846 B2 | 11/2006 | Suwa et al. |
| 7,161,197 B2 | 1/2007 | Nakatsuka et al. |
| 7,173,471 B2 | 2/2007 | Nakatsuka et al. |
| 7,190,933 B2 | 3/2007 | De Ruijter et al. |
| 7,199,635 B2 | 4/2007 | Nakatsuka et al. |
| 7,212,788 B2 | 5/2007 | Weber et al. |
| 7,269,392 B2 | 9/2007 | Nakajima et al. |
| 7,299,018 B2 | 11/2007 | Van Rumpt |
| 7,307,490 B2 | 12/2007 | Kizuki |
| 7,345,342 B2 | 3/2008 | Challa |
| 7,345,521 B2 | 3/2008 | Takahashi et al. |
| 7,355,455 B2 | 4/2008 | Hidaka |
| 7,391,282 B2 | 6/2008 | Nakatsuka et al. |
| 7,404,157 B2 | 7/2008 | Tanabe et al. |
| 7,405,982 B1 | 7/2008 | Flaker et al. |
| 7,432,552 B2 | 10/2008 | Park |
| 7,460,852 B2 | 12/2008 | Burgener et al. |
| 7,515,882 B2 | 4/2009 | Kelcourse et al. |
| 7,518,458 B2 | 4/2009 | Nakamura et al. |
| 7,546,089 B2 | 6/2009 | Bellantoni |
| 7,554,789 B2 | 6/2009 | Chen |
| 7,561,853 B2 | 7/2009 | Miyazawa |
| 7,616,482 B2 | 11/2009 | Prall |
| 7,659,152 B2 | 2/2010 | Gonzalez et al. |
| 7,714,676 B2 | 5/2010 | McKinzie |
| 7,733,156 B2 | 6/2010 | Brederlow et al. |
| 7,733,157 B2 | 6/2010 | Brederlow et al. |
| 7,741,869 B2 | 6/2010 | Hidaka |
| 7,796,969 B2 | 9/2010 | Kelly et al. |
| 7,825,715 B1 | 11/2010 | Greenberg |
| 7,860,499 B2 | 12/2010 | Burgener et al. |
| 7,910,993 B2 | 3/2011 | Brindle et al. |
| 7,928,759 B2 | 4/2011 | Hidaka |

(56) References Cited

U.S. PATENT DOCUMENTS

| | | |
|---|---|---|
| 7,960,772 B2 | 6/2011 | Englekirk |
| 7,982,265 B2 | 7/2011 | Challa et al. |
| 8,044,739 B2 | 10/2011 | Rangarajan et al. |
| 8,536,636 B2 | 9/2013 | Englekirk |
| 8,583,111 B2 | 11/2013 | Burgener et al. |
| 8,638,159 B2 | 1/2014 | Ranta et al. |
| 8,669,804 B2 | 3/2014 | Ranta et al. |
| 9,024,700 B2 | 5/2015 | Ranta |
| 9,106,227 B2 | 8/2015 | Ranta et al. |
| 9,755,615 B2 | 9/2017 | Ranta et al. |
| 2001/0015461 A1 | 8/2001 | Ebina |
| 2001/0031518 A1 | 10/2001 | Kim et al. |
| 2001/0040479 A1 | 11/2001 | Zhang |
| 2001/0045602 A1 | 11/2001 | Maeda et al. |
| 2002/0115244 A1 | 8/2002 | Park et al. |
| 2002/0120103 A1 | 8/2002 | Rosen et al. |
| 2002/0195623 A1 | 12/2002 | Horiuchi et al. |
| 2003/0002452 A1 | 1/2003 | Sahota |
| 2003/0090313 A1 | 5/2003 | Burgener et al. |
| 2003/0141543 A1 | 7/2003 | Bryant et al. |
| 2003/0181167 A1 | 9/2003 | Iida |
| 2003/0201494 A1 | 10/2003 | Maeda et al. |
| 2003/0205760 A1 | 11/2003 | Kawanaka et al. |
| 2003/0222313 A1 | 12/2003 | Fechner |
| 2004/0061130 A1 | 4/2004 | Morizuka |
| 2004/0080364 A1 | 4/2004 | Sander et al. |
| 2004/0129975 A1 | 7/2004 | Koh et al. |
| 2004/0204013 A1 | 10/2004 | Ma et al. |
| 2004/0242182 A1 | 12/2004 | Hikada et al. |
| 2005/0017789 A1 | 1/2005 | Burgener et al. |
| 2005/0068103 A1 | 3/2005 | Dupuis et al. |
| 2005/0077564 A1 | 4/2005 | Forbes |
| 2005/0079829 A1 | 4/2005 | Ogawa et al. |
| 2005/0121699 A1 | 6/2005 | Chen et al. |
| 2005/0127442 A1 | 6/2005 | Veeraraghavan et al. |
| 2005/0151575 A1 | 7/2005 | Sibrai et al. |
| 2005/0167751 A1 | 8/2005 | Nakajima et al. |
| 2005/0285684 A1 | 12/2005 | Burgener et al. |
| 2005/0287976 A1 | 12/2005 | Burgener et al. |
| 2006/0009164 A1 | 1/2006 | Kataoka |
| 2006/0077082 A1 | 4/2006 | Shanks et al. |
| 2006/0160520 A1 | 7/2006 | Naoyuki |
| 2006/0194558 A1 | 8/2006 | Kelly |
| 2006/0194567 A1 | 8/2006 | Kelly et al. |
| 2006/0270367 A1 | 11/2006 | Burgener et al. |
| 2007/0018247 A1 | 1/2007 | Brindle et al. |
| 2007/0023833 A1 | 2/2007 | Okhonin et al. |
| 2007/0045697 A1 | 3/2007 | Cheng et al. |
| 2007/0120103 A1 | 5/2007 | Burgener et al. |
| 2007/0279120 A1 | 12/2007 | Brederlow et al. |
| 2008/0073719 A1 | 3/2008 | Fazan et al. |
| 2008/0076371 A1 | 3/2008 | Dribinsky et al. |
| 2008/0106349 A1 | 5/2008 | McKinzie |
| 2008/0265978 A1 | 10/2008 | Englekirk |
| 2008/0303080 A1 | 12/2008 | Bhattacharyya |
| 2009/0029511 A1 | 1/2009 | Wu |
| 2009/0224843 A1 | 9/2009 | Radoias et al. |
| 2010/0308932 A1* | 12/2010 | Rangarajan .......... H03B 5/1265 331/167 |
| 2011/0002080 A1 | 1/2011 | Ranta |
| 2011/0127849 A1* | 6/2011 | Yoon .................. H03J 3/20 307/109 |
| 2011/0163779 A1 | 7/2011 | Hidaka |
| 2011/0227666 A1 | 9/2011 | Manssen et al. |
| 2013/0208396 A1 | 8/2013 | Bawell et al. |
| 2013/0222075 A1 | 8/2013 | Reedy et al. |
| 2014/0165385 A1 | 6/2014 | Englekirk et al. |
| 2014/0312958 A1 | 10/2014 | Ranta et al. |
| 2015/0364928 A1* | 12/2015 | Yen .................. H04B 5/0037 320/108 |
| 2016/0191039 A1 | 6/2016 | Ranta et al. |
| 2017/0163256 A1 | 6/2017 | Ranta et al. |

FOREIGN PATENT DOCUMENTS

| | | |
|---|---|---|
| EP | 385641 | 9/1990 |
| EP | 0622901 | 11/1994 |
| EP | 782267 | 7/1997 |
| EP | 913939 | 5/1999 |
| EP | 625841 | 11/1999 |
| EP | 1006584 | 7/2000 |
| EP | 2568608 A1 | 3/2013 |
| EP | 2568608 | 5/2014 |
| EP | 2760136 | 7/2014 |
| JP | 55-75348 | 6/1980 |
| JP | S63-164352 | 7/1988 |
| JP | 1254014 | 10/1989 |
| JP | 2161769 | 6/1990 |
| JP | 04-34980 | 2/1992 |
| JP | 4183008 | 6/1992 |
| JP | 5299995 | 11/1993 |
| JP | 6112795 | 4/1994 |
| JP | 06-314985 | 11/1994 |
| JP | 06-334506 | 12/1994 |
| JP | 6334506 | 12/1994 |
| JP | 7046109 | 2/1995 |
| JP | 07-070245 | 3/1995 |
| JP | 07106937 | 4/1995 |
| JP | 8023270 | 1/1996 |
| JP | 8070245 | 3/1996 |
| JP | 8148949 | 6/1996 |
| JP | 11163704 | 6/1996 |
| JP | 8251012 | 9/1996 |
| JP | 08-307305 | 11/1996 |
| JP | 8330930 | 12/1996 |
| JP | 9008627 | 1/1997 |
| JP | 9041275 | 2/1997 |
| JP | 9055682 | 2/1997 |
| JP | 9092785 | 4/1997 |
| JP | 9148587 | 6/1997 |
| JP | 9163721 | 6/1997 |
| JP | 09163721 | 6/1997 |
| JP | 09-200021 | 7/1997 |
| JP | 9181641 | 7/1997 |
| JP | 9186501 | 7/1997 |
| JP | 09200021 | 7/1997 |
| JP | 9200074 | 7/1997 |
| JP | 9238059 | 9/1997 |
| JP | 9243738 | 9/1997 |
| JP | 09-008621 | 10/1997 |
| JP | 9270659 | 10/1997 |
| JP | 9284114 | 10/1997 |
| JP | 9284170 | 10/1997 |
| JP | 9298493 | 10/1997 |
| JP | 9326642 | 12/1997 |
| JP | 10079467 | 3/1998 |
| JP | 10-93471 | 4/1998 |
| JP | 10-242477 | 9/1998 |
| JP | 10-242829 | 9/1998 |
| JP | 10242826 | 9/1998 |
| JP | 10-344247 | 12/1998 |
| JP | 10335901 | 12/1998 |
| JP | 11026776 | 1/1999 |
| JP | 11112316 | 4/1999 |
| JP | 11-136111 | 5/1999 |
| JP | 11163642 | 6/1999 |
| JP | 11205188 | 7/1999 |
| JP | 11274804 | 10/1999 |
| JP | 2000031167 | 1/2000 |
| JP | 2000183353 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001007332 | 1/2001 |
| JP | 2001089448 | 3/2001 |
| JP | 2001-119281 | 4/2001 |
| JP | 2001157487 | 5/2001 |
| JP | 2001156182 | 6/2001 |

(56) References Cited

FOREIGN PATENT DOCUMENTS

| | | |
|---|---|---|
| JP | 2001-510006 | 7/2001 |
| JP | 2001274265 | 10/2001 |
| JP | 2002-033660 | 1/2002 |
| JP | 2002-098712 | 4/2002 |
| JP | 2004515937 | 5/2002 |
| JP | 2000358775 | 6/2002 |
| JP | 2003060451 | 2/2003 |
| JP | 2003101407 | 4/2003 |
| JP | 2003-516083 | 5/2003 |
| JP | 2003143004 | 5/2003 |
| JP | 2003167615 | 6/2003 |
| JP | 2003189248 | 7/2003 |
| JP | 2003332583 | 11/2003 |
| JP | 2002156602 | 12/2003 |
| JP | 2004-147175 | 5/2004 |
| JP | 2004166470 | 6/2004 |
| JP | 2004199950 | 7/2004 |
| JP | 2004288978 | 10/2004 |
| JP | 2005-203643 | 7/2005 |
| JP | 5591356 | 8/2014 |
| KR | 1994027615 | 12/1994 |
| WO | WO86/01037 | 2/1986 |
| WO | WO9523460 | 8/1995 |
| WO | WO9806174 | 2/1998 |
| WO | WO9935695 | 7/1999 |
| WO | WO99/49565 | 9/1999 |
| WO | WO01/41306 | 6/2001 |
| WO | WO0227920 | 4/2002 |
| WO | WO2006038190 | 4/2006 |
| WO | WO2007033045 A2 | 3/2007 |
| WO | 2008133621 | 11/2008 |
| WO | 2009108391 | 9/2009 |

OTHER PUBLICATIONS

Douseki, et al., "A 0.5-V MTCMOS/SIMOX Logic Gate", IEEE Journal of Solid-State Circuits, vol. 32, No. 10, Oct. 1997.

Douseki, et al., "A 0.5v SIMOX-MTMCOS Circuit with 200ps Logic Gate", IEEE Int'l Solid-State Circuits Conference, 1996, pp. 84-85, 423.

Shimomura, et al., "A 1-V 46-ns 16-mb SOI-DRAM with Body Control Technique", IEEE Journal of Solid-State circuits, vol. 32, No. 11, Nov. 1997, pp. 1712-1720.

Ueda, et al., "A CAD Compatible SOI/CMOS Gate Array Having Body Fixed Partially Depleted Transistors", IEEE Int'l Solid-State Circuits Conference, Feb. 8, 1997, pp. 288-289.

Workman, et al., "A Comparative Analysis of the Dynamic Behavior of BTG/SOI MOSFETs and Circuits with Distributed Body Resistance", IEEE Transactions on Electron Devices, vol. 45, No. 10, Oct. 1998, pp. 2138-2145.

Kuang, et al., "A Dynamic Body Discharge Technique for SOI Circuit Applications", IEEE Int'l SOI Conference, Oct. 1999, pp. 77-78.

Assaderaghi, et al., "A Dynamic Threshold Voltage MOSFET (DTMOS) for Ultra-Low Voltage Operation", Int'l Electron Devices Meeting, Dec. 1994, pp. 809-812.

Kuang, et al., "A Floating-Body Charge Monitoring Technique for Partially Depleted SOI Technology", Int'l Journal of Electronics, vol. 91, No. 11, Nov. 2004, pp. 625-637.

Gil, et al., "A High Speed and Low Power SOI Inverter Using Active Body-Bias", Proceedings Int'l Symposium on Low Power Electronics and Design, Aug. 1998, pp. 59-63.

Gil, et al., "A High Speed and Low Power SOI Inverter Using Active Body-Bias", Solid-State Electronics, vol. 43, 1999, pp. 791-799.

Kuang, et al., "A High-Performance Body-Charge-Modulated SOI Sense Amplifier", IEEE Int'l SOI Conference, Oct. 2000, pp. 100-101.

Tinella, et al., "A High-Performance CMOS-SOI Antenna Switch for the 2.5 5GHz Band", IEEE Journal of Solid-State Circuits, vol. 38, No. 7, Jul. 2003, All pgs.

Chung, et al., "A New SOI Inverter for Low Power Applications", IEEE SOI Conference, Oct. 1996, pp. 20-21.

Chung, et al., "A New SOI Inverter Using Dynamic Threshold for Low-Power Applications", IEEE Electron Device Letters, vol. 18, No. 6, Jun. 1997, pp. 248-250.

Chung, et al., "A New SOI MOSFET Structure with Junction Type Body Contact", Int'l Electron Device Meeting (IEDM) Technical Digest, 1999, pp. 59-62.

Terauchi, et al., "A Novel 4T SRAM Cell Using "Self-Body-Biased" SOI MOSFET Structure Operating at 0.5 Volt", IEEE Int'l SOI Conference, Oct. 2000, pp. 108-109.

Wang, et all., "A Novel Low-Voltage Silicon-On-Insulator (SOI) CMOS Complementary Pass-Transistor Logic (CPL) circuit Using Asymmetrical Dynamic Threshold Pass-Transistor (ADTPT) Technique", Proceedings of the 43rd IEEE Midwest Symposium on Circuits and Systems, Aug. 2000, pp. 694-697.

Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 24-26.

Das, et al., "A Novel Sub-1 V High Speed Circuit Design Technique in Partially Depleted SOI-CMOS Technology with Ultra Low Leakage Power", Proceedings of the 28th European Solid-State Circuits Conference, Sep. 2002, pp. 267-270.

Kanda, et al., "A Si RF Switch MMIC for the Cellular Frequency Band Using SOI-CMOS Technology", Institute of Electronics, Information and Communication Engineers Technical Report, vol. 100, No. 152, Jun. 2000, pp. 79-83.

Hu, et al., "A Unified Gate Oxide Reliability Model", IEEE 37th Annual Int'l Reliability Physics Symposium, 1999, pp. 47-51, San Diego, California.

Nakatani, "A Wide Dynamic Range Switched-LNA in SiGe BICMOS", IEEE Radio Frequency Integrated Circuits Symposium, 2001, pp. 223-226.

Tseng, et al., "AC Floating-Body Effects and the Resultant Analog Circuit Issues in Submicron Floating body and Body-Grounded SOI MOSFET's", IEEE Transactions on Electron Devices, vol. 46, No. 8, Aug. 1999, pgs. All.

Tseng, et al., "AC Floating-Body Effects in Submicron Fully Depleted (FD) SOI nMOSFET's and the Impact on Analog Applications", IEEE Electron Devices, vol. 19, No. 9, Sep. 1998, pp. 351-353.

Wada, et al., "Active Body-Bias SOI-CMOS Driver Circuits", Symposium on VLSI Circuits Digest of Technical Papers, 1997, pp. 29-30.

Stuber, et al., Amendment filed in the USPTO dated Jun. 10, 2010 for related U.S. Appl. No. 11/520,912, 28 pgs.

Saccamango, et al., "An SOI Floating Body Charge Monitor Technique", IEEE Int'l SOI Conference, Oct. 2000, pp. 88-89.

Lee, et al., "Analysis of Body Bias Effect with PD-SOI or Analog and RF Applications", Solid State Electron, vol. 46, 2002, pp. 1169-1176.

Dunga, "Analysis of Floating Body Effects in Thin Film SOI MOSFET's Using the GIDL Current Technique", Proceedings of the 8th Int'l Symposium on Physical and Failure Analysis of Integrated Circuits, 2001, pp. 254-257.

Gautier, et al., "Body Charge Related Transient Effects in Floating Body SOI NMOSFETs", IEDM Tech. Digest, 1995, pp. 623-626.

Koh, et al., "Body-Contracted SOI MOSFET Structure and its Application to DRAM", IEEE Transactions on Electron Devices, vol. 45, No. 5, May 1998, pp. 1063-1070.

Koh, et al., "Body-Contacted SOI MOSFET Structure with Fully Bulk CMOS Compatible Layout and Process", IEEE Electron Device Letters, vol. 18, No. 3, Mar. 1997, pp. 102-104.

Tseng, et al., "Characterization of Floating Body and Body-Grounded Thin Film Silicon-on-Insulator MOSFETs for Analog Circuit Applications", Ph.D. Thesis, UCLA, 1999, pp. All.

Madihian, et al., "CMOS RF ICs for 900MHz-2.4GHz Band Wireless Communication Networks", IEEE Radio Frequency Integrated Circuits Symposium, 1999, pp. 13-16.

Orndorff, et al., "CMOS/SOS/LSI Switching Regulator Control Device", IEEE Int'l Solid-State Circuits Conference, ISSCC 78, Feb. 1978, pp. 234-235, 282.

(56) References Cited

OTHER PUBLICATIONS

Eschenbach, Communication from the EPO dated Feb. 4, 2009 for related appln. No. 06786943.8, 101 pgs.
Shingleton, Communication from the USPTO dated Apr. 28, 2009 for related U.S. Appl. No. 11/881,816, 3 pgs.
Dribinsky, Response file in USPTO dated Aug. 28, 2009 to related U.S. Appl. No. 11/881,816.
Matloubian, "Smart Body Contact for SOI MOSFETs", 1989 IEEE SOS/SOI Technology Conference, Oct. 1999, pp. 128-129.
Chuang, et al., "SOI for Digital CMOS VLSI Design: Design Consideration and Advances", Proceedings of the IEEE, vol. 86, No. 4, Apr. 1998, pp. 689-720.
Chung, et al., "SOI MOSFET Structure with a Junction Type Body Contact for Suppression of Pass Gate Leakage", IEEE Transactions on Elelctron Devices, vol. 48, No. 7, Jul. 2001.
Rozeau, et al., "SOI Technologies Overview for Low-Power Low-Voltage Radio-Frequency Aplications", Analog Integrated Circuits and Signal Processing, 25, Kluwer Academic Publishers, Nov. 2000, pp. 93-114.
Kuge, et al., "SOI-DRAM Circuit Technologies for Low Power High Speed Multigiga Scale Memories", IEEE Journal 01 Solid-State Circuits, vol. 31, No. 4, Apr. 1996, pp. 586-591.
Kuang, et al., "SRAM Bitline Circuits on PD SOI:Advantages and Concerns", IEEE Journal of Solid-State Circuits, vol. 32, No. 6, Jul. 1997.
Brindle, et al., Response filed in the EPO for related appln. No. 06814836.0-1235 dated Oct. 12, 2010.
Fuse, et al., "0.5V SOI CMOS Pass-Gate Logic", 1996 IEEE Int'l Solid-State Circuits Conference, Feb. 1996, pp. 88-89,424.
Hirota, et a., "0.5V 320MHz 8b Multiplexer/Demultiplexer Chips Based on a Gate Array with Regular-Structured DTMOS/SOI", ISSCC, Feb. 1998, pp. 12.2-1-12.2-11.
Maeda, et al., "Substrate-Bias Effect and Source-Drain Breakdown Characteristics in Body-Tied Short-Channel SOI MOSFET's", IEEE Transactions on Electron Devices, vol. 46, No. 1, Jan. 1999, pp. 151-158.
Morena, Supplementary European Search Report dated Feb. 17, 2010 relating to appln. No. 06814836.0.
Duyet, et al., "Suppression of Geometric Component of Charge Pumping Current in Thin Film Silicon on Insulator Metal-Oxide-Semiconductor Field-Effect Transistors", Japanese Journal of Applied Physics, vol. 37, Jul. 1998, pp. L855-L858.
Casu, et al., "Synthesis of Low-Leakage PD-SOI Circuits with Body Biasing", Int'l Symposium on Low Power Electronics and Design, Aug. 2001, pp. 287-290.
Edwards, et al., "The Effect of Body Contact Series Resistance on SOI CMOS Amplifier Stages", IEEE Transactions on Electron Devices, vol. 44, No. 12, Dec. 1997, pp. 2290-2294.
Wang, et al., "Threshold Voltage Instability at Low Temperatures in Partially Depleted Thin Film SOI MOSFET's", 1990 IEEE SOS/SOI Technology Conference, Oct. 1990, pp. 91-92.
Shimomura, et al., "TP 4.3: a 1V 46ns 16Mb SOI-DRAM with Body Control Technique", 1997 IEEE Int'l Solid-State Circuits Conference, Feb. 1997.
Sleight, et al., "Transient Measurements of SOI Body Contact Effectiveness", IEEE Electron Device Letters, vol. 19, No. 12, Dec. 1998.
Assaderaghi, et al, "Transient Pass-Transistor Leakage Current in SOI MOSFET's", IEEE Electron Device Letters, vol. 18, No. 6, Jun. 1997, pp. 241-243.
Brindle, et al., Translation of a response filed with the Chinese Patent Office dated Nov. 30, 2009 relating to appln. No. 200680025128.7.
Mashiko, et al., "Ultra-Low Power Operation of Partially-Depleted SOI/CMOS Integrated Circuits", IEICE Transactions on Electronic Voltage, No. 11, Nov. 2000, pp. 1697-1704.
Das, et al., "Ultra-Low-Leakage Power Strategies for Sub-1 V VLSI: Novel Circuit Styles and Design Methodologies for Partially Depleted Silicon-on-Insulator (PD-SOI) CMOS Technology", Proceedings of the 16th Int'l Conference on VLSI Design, 2003.
Pelloie, et al., "WP 25.2: SOI Technology Performance and Modeling", 1999 IEEE Int'l Solid-State Circuits Conference, Feb. 1999.
Goldman, et al., "0.15um SOI DRAM Technology Incorporating Sub-Volt Dynamic Threshold Devices for Embedded Mixed-Signal & RF Circuits", 2001 IEEE SOI Conference, Oct. 2001, pp. 97-98.
Sudhama, et al., "Compact Modeling and Circuit Impact of a Novel Frequency Dependence of Capacitance in RF 11/MOSFETs", Nano Science and Technology Institute, Technical Proceedings of the 2001 Int'l Conference of Modeling and Simulation of Microsystems. 2001.
Casu, et al., "Comparative Analysis of PD-SOI Active Body-Biasing Circuits", IEEE Int'l SOI Conference, Oct. 2000, pp. 94-95.
Cho, et al., "Comparative Assessment of Adaptive Body-Bias SOI Pass-Transistor Logic", Fourth Int'l Symposium on Quality Electronic Design, Mar. 2003, pp. 55-60.
Chan, et al., "Comparative Study of Fully Depleted and Body-Grounded Non Fully Depleted SOI MOSFET's for High Performance Analog and Mixed Signal Circuits", IEEE Transactions on Electron Devices, vol. 42, No. 11, Nov. 1995, pp. 1975-1981.
Tseng, et al. "Comprehensive Study on AC Characteristics in SOI MOSFETs for Analog Applications", 1998 Symposium on VLSI Technology Digest of Technical Papers, Jun. 1998.
Pelella, et al., "Control of Off-State Current in Scaled PD/SOI CMOS Digital Circuits", Proceedings IEEE Int'l SOI Conference, Oct. 1998, pp. 147-148.
Assaderaghi, "DTMOS: Its Derivatives and Variations, and Their Potential Applications", The 12th Int'l Conference on Microelectronics, Nov. 2000, pp. 9-10.
Hameau, et al., "Radio-Frequency Circuits in Integration Using CMOS SOI 0.25um Technology", 2002 RF IC Design Workshop Europe, Mar. 2002, Grenoble, France.
Lindert, et al. "Dynamic Threshold Pass-Transistor Logic for Improved Delay at Lower Power Supply Voltages", IEEE Journal of Solid-State Circuits, vol. 34, No. 1, Jan. 1999, pp. 85-89.
Drake, et al., "Dynamic-Threshold Logic for Low Power VLSI Design", www.research.ibm.com/acas, 2001.
Assaderaghi, et al., "Dynamic Threshold-Voltage MOSFET (DTMOS) for Ultra-Low Voltage VLSI", IEEE Transactions on Electron, vol. 44, No. 3, Mar. 1997, pp. 414-422.
Photocopy of a translation of an Office Action dated Jul. 31, 2009 for related Chinese appln. No. 200680025128.7.
Wei, et al., "Effect of Floating-Body Charge on SOI MOSFET Design", IEEE Transaction on Electron Devices, vol. 45, No. 2, Feb. 1998.
Duyet, et al., "Effects of Body Reverse Pulse Bias on Geometric Component of Charge Pumping Current in FD SOI MOSFETs", Proceedings IEEE Int'l SOI Conference, Oct. 1998, pp. 79-80.
Lee, et al., "Effects of Gate Structure on the RF Performance in PD SOI MOSFETs", IEEE Microwave and Wireless Components Letters, vol. 15, No. 4, Apr. 2005.
Krishnan, "Efficacy of Body Ties Under Dynamic Switching Conditions in Partially Depleted SOI CMOS Technology", Proceedings IEEE Int'l SOI Conference, Oct. 1997, pp. 140-141.
Lu, et al., "Floating Body Effects in Partially Depleted SOI CMOS Circuits", ISPLED, Aug. 1996, pp. 1-6.
Ueda, et al., "Floating Body Effects on Propagation Delay in SOI/CMOS LSIs", IEEE SOI Conference, Oct. 1996, pp. 142-143.
Matsumoto, et al., "Fully Depleted 30-V-Class Thin Film SOI Power MOSFET", IEDM 95-979, 1995, pp. 38.6.1-38.6.4.
Lee, et al., "Harmonic Distortion Due to Narrow Width Effects in Deep Submicron SOI-CMOS Device for Analog-RF Applications", IEEE Int'l SOI Conference, Oct. 2002, pp. 83-85.
Stuber, et al., Photocopy of an amendment that was filed with the USPTO dated Sep. 8, 2009 for related U.S. Appl. No. 11/520,912.
Assaderaghi, et al., "History Dependence of Non-Fully Depleted (NFD) Digital SOI Circuits", 1996 Symposium on VLSI Technology Digest of Technical Papers 13.1, 1996, pp. 122-123.
Stuber, et al., Photocopy of an amendment that was filed with the USPTO dated Mar. 16, 2009 for related U.S. Appl. No. 11/520,912.
Damiano, et al., "Integrated Dynamic Body Contact for H Gate PD SOI MOSFETs for High Performance/Low Power", IEEE SOI Conference, Oct. 2004, pp. 115-116.

(56) References Cited

OTHER PUBLICATIONS

Tat, International Search Report and Written Opinion received from USRO dated Jul. 3, 2008 for related appln. No. PCT/US06/36240.
Rauly, et al., Investigation of Single and Double Gate SOI MOSFETs in Accumulation Mode for Enhanced Performances and Reduced Technological Drawbacks, Proceedings 30th European Solid-State Device Research Conference, Sep. 2000, pp. 540-543.
Morishita, et al., "Leakage Mechanism Due to Floating Body and Countermeasure on Dynamic Retention Mode of SOI-DRAM", 1995 Symposium on VLSI Technology Digest of Technical Papers, Apr. 1995, pp. 141-142.
Keys, "Low Distortion Mixers or RF Communications", Ph.D. Thesis, University of California-Berkeley, 1995.
Suehle, et al., "Low Electric Field Breakdown of Thin SiO2 Films Under Static and Dynamic Stress", IEEE Transactions on Electron Devices, vol. 44, No. 5, May 1997.
Chen, et al., "Low Power, Multi-Gigabit DRAM Cell Design Issues Using SOI Technologies", http://bwrc.eecs.berkeley.edu/people/grad_students/chenff/reports, May 1999.
Shahidi, et al., "Partially Depleted SOI Technology for Digital Logic", IEEE Int'l Solid-State Circuits Conference, 1999, pp. 426-427.
Pelella, et al., "Low-Voltage Transient Bipolar Effect Induced by Dynamic Floating-Body Charging in Scaled PD/SOI MOSFET's", IEEE Electron Device Letters, vol. 17, No. 5, May 1996.
Wei, "Measurement and Modeling of Transient Effects in Partially Depleted SOI MOSFETs", M.S. Thesis, MIT, Jul. 1996.
Wei, et al., "Measurement of Transient Effects in SOI DRAM/SRAM Access Transistors", IEEE Electron Device Letters, vol. 17, No. 5, May 1996.
Tat, Office Action received from USPTO dated Sep. 15, 2008 for related U.S. Appl. No. 11/520,912.
Shoucair, "Modeling, Decoupling and Supression of MOSFET Distortion Components", IEEE Proceeding Circuit Devices Systems, vol. 146, No. 1, Feb. 1999.
Tat, Notice of Allowance received from USPTO dated Sep. 16, 2010 for related U.S. Appl. No. 11/520,912.
Shingleton, Office Action received from USPTO dated Oct. 7, 2008 for related U.S. Appl. No. 11/881,816.
Tat, Office Action received from USPTO dated Dec. 10, 2009 for related U.S. Appl. No. 11/520,912.
Shingleton, Office Action received from USPTO dated Jan. 19, 2010 for related U.S. Appl. No. 11/881,816.
Tat, Office Action received from USPTO dated Jul. 8, 2009 for related U.S. Appl. No. 11/520,912.
Numata, et al., "A +2.4/0 V Controlled High Power GaAs SPDT Antenna Switch IC for GSM Application", IEEE Radio Frequency Integrated Circuits Symposium, 2002, pp. 141-144.
Huang, et al., "A 0.5-um CMOS T/R Switch for 900-MHz Wireless Applications", IEEE Journal of Solid-State Circuits, 2001, pp. 486-492.
Tinella, et al., "A 0.7dB Insertion Loss CMOS—SOI Antenna Switch with More than 50dB Isolation over the 2.5 to 5GHz Band", Proceeding of the 28th European Solid-State Circuits Conference, 2002, pp. 483-486.
Ohnakado, et al., "A 1.4dB Insertion Loss, 5GHz Transmit/Receive Switch Utilizing Novel Depletion-Layer Extended Transistors (DETs) in 0.18um CMOS Process", Symposium on VLSI Circuits Digest of Technical Papers, 2002, pp. 162-163.
Nakayama, et al., "A 1.9 GHz Single-Chip RF Front-End GaAs MMIC with Low-Distortion Cascade FET Mixer for Personal Handy-Phone System Terminals", IEEE, 1998, pp. 101-104.
McGrath, et al., "A 1.9-GHz GaAs Chip Set for the Personal Handyphone System", IEEE Transaction on Microwave Theory and Techniques, 1995, pp. 1733-1744.
Nakayama, et al., "A 1.9GHz Single-Chip RF Front End GaAs MMIC for Personal Communications", Microwave and Millimeter-Wave Monolithic Circuits Symposium, 1996, pp. 69-72.
Nakayama, et al., "A 1.9GHz Single-Chip RF Front End GaAs MMIC with Low-Distortion Cascode FET Mixer for Personal Handy-Phone System Terminals", Radio Frequency Integrated Circuits Symposium, 1998, pp. 205-208.
Gu, et al., "A 2.3V PHEMT Power SP3T Antenna Switch IC for GSM Handsets", IEEE GaAs Digest, 2003, pp. 48-51.
Darabi, et al., "A 2.4GHz CMOS Transceiver for Bluetooth", IEEE, 2001, pp. 89-92.
Valeri, et al., "A Silicon-on-Insulator Circuit for High Temperature, High-Voltage Applications", IEEE, 1991, pp. 60-61.
Huang et al., "A 2.4-GHz Single-Pole Double Throw T/R Switch with 0.8-dB Insertion Loss Implemented in a CMOS Process", Silicon Microwave Integrated Circuits and Systems Research, 2001, pp. 1-4.
Huang, et al., "A 2.4-GHz Single-Pole Double Throw T/R Switch with 0.8-dB Insertion Loss Implemented in a CMOS Process (slides)", Silicon Microwave Integrated Circuits and Systems Research, 2001, pp. 1-16.
Yamamoto, et al., "A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197.
Kawakyu, et al., "A 2-V Operation Resonant Type T/R Switch with Low Distortion Characteristics for 1.9GHz PHS", IEICE Trans Electron, vol. E81-C, No. 6, Jun. 1998, pp. 862-867.
Caverly, et al., "A Silicon CMOS Monolithic RF and Microwave Switching Element", 27th European Microwave Conference, 1997, pp. 1046-1051.
Huang, et al., "A 900-MHz T/R Switch with a 0.8-dB Insertion Loss Implemented in a 0.5-um CMOS Process", IEEE Custom Integrated Circuits Conference, 2000, pp. 341-344.
Workman, et al., "A Comparative Analysis of the Dynamic Behavior of BTG/SOI MOSFET's and Circuite with Distributed Body Resistance", IEEE Transactions and Electron Devices, vol. 45, No. 10, Oct. 1998, pp. 2138-2145.
Valeri, et al., "A Composite High Voltage Device Using Low Voltage SOI MOSFET's", IEEE, 1990, pp. 169-170.
Kanda, et al., "A Si RF Switch MMIC for the Cellular Frequency Band Using SOI-CMOS Technology", The Institute of Electronics, Information and Communication Engineers, 2000, pp. 79-83.
Miyatsuji, et al., "A GaAs High Power RF Single Pole Double Throw Switch IC for Digital Mobile Communication System", IEEE International Solid-State Circuits Conference, 1994, pp. 34-35.
Miyatsuji, et al., "A GaAs High Power RF Single Pole Dual Throw Switch IC for Digital Mobile Communication System", IEEE Journal of Solid-State Circuits, 1995, pp. 979-983.
DeRossi, et al., "A Routing Switch Based on a Silicon-on-Insulator Mode Mixer", IEEE Photonics Technology Letters, 1999, pp. 194-196.
Puechberty, et al., "A GaAs Power Chip Set for 3V Cellular Communications", 1994.
Yamamoto, et al., "A GaAs RF Transceiver IC for 1.9GHz Digital Mobile Communication Systems", ISSCC96, 1996, pp. 340-341, 469.
Choumei, et al., "A High Efficiency, 2V Single Supply Voltage Operation RF Front End MMIC for 1.9GHz Personal Handy Phone Systems", IEEE, 1998, pp. 73-76.
Harjani, et al., "A Prototype Framework for Knowledge Based Analog Circuit Synthesis", IEEE Design Automation Conference, 1987, pp. 42-49.
Schindler, et al., "A High Power 2-18 GHz T/R Switch", IEEE Microwave and Millimeter-Wave Monolithic Circuits Symposium, 1990, pp. 119-122.
Gu, et al., "A High Power DPDT MMIC Switch for Broadband Wireless Applications", IEEE MTT-S Digest, 2003, pp. 173-176.
Caverly, "A Project Oriented Undergraduate CMOS Analog Microelectronic System Design Course", IEEE, 1997, pp. 87-88.
Tinella, et al., "A High Performance CMOS-SOI Antenna Switch for the 2.5-5-GHz Band", IEEE Journal of Solid-State Circuits, 2003, pp. 1279-1283.
Gu, et al., "A High Performance GaAs SP3T Switch for Digital Cellular Systems", IEEE MTT-S Digest, 2001, pp. 241-244.

(56) References Cited

OTHER PUBLICATIONS

Numata, et al., "A High Power Handling GSM Switch IC with New Adaptive Control Voltage Generator Circuit Scheme", IEEE Radio Frequency Integrated Circuits Symposium, 2003, pp. 233-236.
Madihian, et al., "A High Speed Resonance Type FET Transceiver Switch for Millimeter Wave Band Wireless Networks", 26th EuMC, 1996, pp. 941-944.
Giugni, "A Novel Multi-Port Microwave/Millimeter-Wave Switching Circuit", Microwave Conference, 2000.
Tokumitsu, et al., "A Low Voltage High Power T/R Switch MMIC Using LC Resonators", IEEE Transactions on Microwave Theory and Techniques, 1995, pp. 997-1003.
Colinge, et al., "A Low Voltage Low Power Microwave SOI MOSFET", IEEE International SOI Conference, 1996, pp. 128-129.
Johnson, et al., "A Model for Leakage Control by MOS Transistor Stacking", ECE Technical Papers, 1997, pp. 1-28.
Matsumoto, et al., "A Novel High Frequency Quasi-SOI Power MOSFET for Multi-Gigahertz Application", IEEE, 1998, pp. 945-948.
Yamamoto, et al., "A Single-Chip GaAs RF Transceiver for 1.9GHz Digital Mobile Communication Systems", IEEE Journal of Solid-State Circuits, 1996.
Yamamoto, et al., "A Single-Chip GaAs RF Transceiver for 1.9GHz Digital Mobile Communication Systems", IEEE, 1996, pp. 1964-1973.
Tsutsumi, et al., "A Single Chip PHS Front End MMIC with a True Single +3 Voltage Supply", IEEE Radio Frequency Integrated Circuits Symposium, 1998, pp. 105-108.
Wambacq, et al., "A Single Package Solution for Wireless Transceivers", IEEE, 1999, pp. 1-5.
Eggert, et al., A SOI-RF-CMOS Technology on High Resistivity SIMOX Substrates for Microwave Applications to 5 GHz, IEEE Transactions on Electron Devices, 1997, pp. 1981-1989.
Hu, et al., "A Unified Gate Oxide Reliability Model", IEEE 37th Annual International Reliability Physic Symposium, 1999, pp. 47-51.
Baker, et al., "Designing Nanosecond High Voltage Pulse Generators Using Power MOSFET's", Electronic Letters, 1994, pp. 1634-1635.
Henshaw, "Design of an RF Transceiver", IEEE Colloquium on Analog Signal Processing, 1998.
Savla, "Design and Simulation of a Low Power Bluetooth Transceiver", The University of Wisconsin, 2001, pp. 1-90.
Szedon, et al., "Advanced Silicon Technology for Microwave Circuits", Naval Research Laboratory, 1994, pp. 1-110.
Johnson, et al., "Advanced Thin Film Silicon-on-Sapphire Technology: Microwave Circuit Applications", IEEE Transactions on Electron Devices, 1998, pp. 1047-1054.
Yamamoto, et al., "Design and Experimental Results of a 2V-Operation Single-Chip GaAs T/R MMIC Front-End for 1.9GHz Personal Communications", IEEE, 1998, pp. 7-12.
Burgener, et al., Amendment filed in the USPTO dated Dec. 2005 relating to U.S. Appl. No. 10/922,135.
Burgener, et al., Amendment filed in the USPTO dated May 2008 relating to U.S. Appl. No. 11/582,206.
Kai, An English translation of an Office Action received from the Japanese Patent Office dated Jul. 2010 relating to appln. No. 2007-518298.
Van Der Peet, Communications pursuant to Article 94(3) EPC dated Aug. 2009 relating to appln. No. 02800982.7-2220.
Weman, Communication under Rule 71(3) EPC and Annex Form 2004 received from the EPO dated Nov. 2009 relating to appln. No. 020800982.7.
Aquilani, Communications pursuant to Article 94(3) EPC received from the EPO dated Mar. 2010 relating to appln. No. 05763216.8.
Burgener, et al., Amendment filed in the USPTO dated Apr. 2010 relating to U.S. Appl. No. 11/501,125.
Heller, et al., "Cascode Voltage Switch Logic: A Different CMOS Logic Family", IEEE International Solid-State Circuits Conference, 1984, pp. 16-17.

Pylarinos, "Charge Pumps: An Overview", Proceedings of the IEEE International Symposium on Circuits and Systems, 2003, pp. 1-7.
Van Der Peet, Communications pursuant to Article 94(3) EPC received from the EPO dated Jun. 2008 relating to appln. No. 02800982.7-2220.
Aquilani, Communication and supplementary European Search Report dated Nov. 2009 relating to appln. No. 05763216.
Doyama, "Class E Power Amplifier for Wireless Transceivers", University of Toronto, 1999, pp. 1-9.
"CMOS Analog Switches", Harris, 1999, pp. 1-9.
Burgener, et al., Comments on Examiners Statements of Reasons for Allowance filed in the USPTO dated Aug. 2004 relating to U.S. Appl. No. 10/267,531.
Orndorff, et al., CMOS/SOS/LSI Switching Regulator Control Device, IEEE International, vol. XXI, Feb. 1978, pp. 234-235.
Eggert, et al., "CMOS/SIMOX-RF-Frontend for 1.7GHz", Solid State Circuits Conference, 1996.
"CMOS SOI RF Switch Family", Honeywell, 2002, pp. 1-4.
"CMOS SOI Technology", Honeywell, 2001, pp. 1-7.
Burgener, "CMOS SOS Switches Offer Useful Features, High Integration", Microwaves & RF, 2001, pp. 107-118.
Analog Devices, "CMOS, Low Voltage RF/Video, SPST Switch", Analog Devices, inc., 1999, pp. 1-10.
Caverly, "Development of a CMOS Cell Library for RF Wireless and Telecommunications Applications", VLSI Symposium, 1998.
Megahed, et al., "Low Cost UTSi Technology for RF Wireless Applications", IEEE MTT-S Digest, 1998.
Adan, et al., "Linearity and Low Noise Performance of SOIMOSFETs for RF Applications", IEEE International SOI conference, 2000, pp. 30-31.
Caverly, "Distortion Properties of Gallium Arsenide and Silicon RF and Microwave Switches", IEEE, 1997, pp. 153-156.
Caverly, "Linear and Nonlinear Characteristics of the Silicon CMOS Monolithic 50-Omega Microwave and RF Control Element", IEEE Journal of Solid-State Circuits, 1999, pp. 124-126.
Iyama, et al., "L-Band SPDT Switch Using Si-MOSFET", IEICE Trans. Electron, vol. E79-C, No. 5, May 1996, pp. 636-643.
Suematsu, et al., "L-Band Internally Matched SI-MMIC Front End", IEEE, 1996, pp. 2375-2378.
Luu, Final Office Action received from the USPTO dated Apr. 2009 relating to U.S. Appl. No. 11/351,342.
Marenk, et al., "Layout Optimization of Cascade RE SOI Transistors", IEEE International SOI Conference, 2001, pp. 105-106.
Colinge, "Fully Depleted SOI CMOS for Analog Applications", IEEE Transactions on Electron Devices, 1998, pp. 1010-1016.
Flandre, et al., "Fully Depleted SOI CMOS Technology for Low Voltage Low Power Mixed Digital/Analog/Microwave Circuits", Analog Integrated Circuits and Signal Processing, 1999, pp. 213-228.
Yamao, "GaAs Broadband Monolithic Switches", 1986, pp. 63-71.
Gopinath, et al., "GaAs FET RF Switches", IEEE Transactions on Electron Devices, 1985, pp. 1272-1278.
Le, International Search Report from the USPTO dated Mar. 2003 relating to U.S. Appl. No. 10/267,531.
Bonkowski, et al., "Integraton of Triple Band GSM Antenna Switch Module Using SOI CMOS", IEEE Radio Frequency Integrated Circuits Symposium, 2004, pp. 511-514.
Lee, et al., "Harmonic Distortion Due to Narrow Width Effects in Deep Submicron SOI-CMOS Device for Analog RF Applications", 2002 IEEE International SOI Conference, Oct. 2002.
HI-5042 thru HI-5051 Datasheet, Harris Corporation, 1999.
Eisenberg, et al., "High Isolation 1-20GHz MMIC Switches with On-Chip Drivers", IEEE Microwave and Millimeter-Wave Monolithic Circuits Symposium, 1989, pp. 41-45.
Kelly, "Integrated Ultra CMIS Designs in GSM Front End", Wireless Design Magazine, 2004, pp. 18-22.
Shifrin et al., "High Power Control Components Using a New Monolithic FET Structure", IEEE Microwave and Millimeter-Wave Monolithic Circuits Symposium, 1988, pp. 51-56.
Kohama, et al., "High Power DPDT Antenna Switch MMIC for Digital Cellular Systems", GaAs IC Symposium, 1995, pp. 75-78.

(56) References Cited

OTHER PUBLICATIONS

Kohama, et al., "High Power DPDT Antenna Switch MMIC for Digital Cellular Systems", IEEE Journal of Solid-State circuits, 1996, pp. 1406-1411.
Yun, et al., "High Power-GaAs MMIC Switches wtih Planar Semi-Insulated Gate FETs (SIGFETs)", International Symposium on Power Semiconductor Devices & ICs, 1990, pp. 55-58.
Caverly, "High Power Gallium Nitride Devices for Microwave and RF Control Applications", 1999, pp. 1-30.
Caverly, "High Power Gallium Nitride Devices for Microwave and RF Control Applications", 2000, pp. 1-33.
Masuda, et al., "High Power Heterojunction GaAs Switch IC with P-1dB of more than 38dBm for GSM Application", IEEE, 1998, pp. 229-232.
De Boer, et al., "Highly Integrated X-Band Multi-Function MMIC with Integrated LNA and Driver Amplifier", TNO Physics and Electronics Laboratory, 2002, pp. 1-4.
Kanda, et al., "High Performance 19GHz Band GaAs FET Switches Using LOXI (Layerd Oxide Isolation)—MESFETs", IEEE, 1997, pp. 62-65.
Uda, et al., "High-Performance GaAs Switch IC's Fabricated Using MESFET's with Two Kinds of Pinch-Off Voltages and a Symmetrical Pattern Configuration", IEEE Journal of Solid-State Circuits, vol. 29, No. 10, Oct. 1994, pp. 1262-1269.
Uda, et al., "High Performance GaAs Switch IC's Fabricated Using MESFETs with Two Kinds of Pinch Off Voltages", IEEE GaAs IC Symposium, 1993, pp. 247-250.
Armijos, "High Speed DMOS FET Analog Switches and Switch Arrays", Temic Semiconductors 1994, pp. 1-10.
Katzin, et al., "High Speed 100+ W RF Switches Using GaAs MMICs", IEEE Transactions on Microwave Theory and Techniques, 1992, pp. 1989-1996.
Honeywell, "Honeywell SPDT Absorptive RF Switch", Honeywell, 2002, pp. 1-6.
Honeywell, "Honeywell SPDT Reflective RF Switch", Honeywell Advance Information, 2001, pp. 1-3.
Hirano, et al., "Impact of Actively Body Bias Controlled (ABC) SOI SRAM by Using Direct Body Contact Technology for Low Voltage Application", IEEE, 2003, pp. 2.4.1-2.4.4.
Larson, "Integrated Circuit Technology Options for RFIC's—Present Status and Future Directions", IEEE Journal of Solid-State Circuits, 1998, pp. 387-399.
Burghartz, "Integrated RF and Microwave Components in BiCMOS Technology", IEEE Transactions on Electron Devices, 1996, pp. 1559-1570.
Gu, et al., "Low Insertion Loss and High Linearity PHEMT SPDT and SP3T Switch Ics for WLAN 802.11a/b/g Application", 2004 IEEE Radio Frequency Integrated Circuits Symposium, 2004, pp. 505-508.
"Radiation Hardened CMOS Dual DPST Analog Switch", Intersil, 1999, pp. 1-2.
Koudymov, et al., "Low Loss High Power RF Switching Using Multitinger AlGaN/GaN MOSHFETs", University of South Carolina Scholar Commons, 2002, pp. 449-451.
Abidi, "Low Power Radio Frequency IC's for Portable Communications", IEEE, 1995, pp. 544-569.
Kuo, et al., "Low Voltage SOI CMOS VLSI Devices and Circuits", Wiley, 2001, pp. 57-60, 349-354.
Kelly, Proposed Amendment After Final from the USPTO dated Jun. 2009 relating to U.S. Appl. No. 11/351,342.
Wei, et al., "Measuremenets of Transient Effects in SOI DRAM/SRAM Access Transistors", IEEE Electron Device Letters, vol. 17, No. 5, May 1996.
Caverly, et al., "On-State Distortion in High Electron Mobility Transistor Microwave and RF Switch Control Circuits", IEEE Transactions on Microwave Theory and Techniques, 2000, pp. 98-103.
Suematsu, "On-Chip Matching SI-MMIC for Mobile Communication Terminal Application", IEEE, 1997, pp. 9-12.
De La Houssaye, et al., "Microwave Performance of Optically Fabricated T-Gate Thin Film Silicon on Sapphire Based MOSFET's", IEEE Electron Device Letters, 1995, pp. 289-292.
Chow, Office Action from the USPTO dated Aug. 2010 relating to U.S. Appl. No. 11/347,671.
Luu, Office Action from the USPTO dated Oct. 2008 relating to U.S. Appl. No. 11/351,342.
Tieu, Office Action from the USPTO dated Sep. 2009 relating to U.S. Appl. No. 11/347,014.
Chow, Office Action from the USPTO dated Apr. 2010 relating to U.S. Appl. No. 11/347,671.
Tieu, Notice of Allowance from the USPTO dated Jun. 2006 relating to U.S. Appl. No. 10/922,135.
Tieu, Office Action from the USPTO dated Jun. 2005 relating to U.S. Appl. No. 10/922,135.
Tieu, Office Action from the USPTO dated Nov. 2007 relating to U.S. Appl. No. 11/582,206.
Shifrin, et al., "Monolithic FET Structure for HighPower Control Component Applications", IEEE Transactions on Microwave Theory and Techniques, 1989, pp. 2134-2142.
Smuk, et al., "Monolithic GaAs Multi-Throw Switches with Integrated Low Power Decoder/Driver Logic", 1997, IEEE Radio Frequency Integrated Circuits.
McGrath, et al., "Multi Gate FET Power Switches", Applied Microwave, 1991, pp. 77-88.
Smuk, et al., "Multi-Throw Plastic MMIC Switches up to 6GHz with Integrated Positive Control Logic", IEEE, 1999, pp. 259-262.
McGrath, et al., "Novel High Performance SPDT Power Switches Using Multi-Gate FET's", IEEE, 1991, pp. 839-842.
Razavi, "Next Generation RF Circuits and Systems", IEEE, 1997, pp. 270-282.
Gould, et al., "NMOS SPDT Switch MMIC with >48dB Isolation and 30dBm IIP3 for Applications within GSM and UMTS Bands", Bell Labs, 2001, pp. 1-4.
Caverly, "Nonlinear Properties of Gallium Arsenide and Silicon FET-Based RF and Microwave Switches", IEEE, 1998, pp. 1-4.
Tieu, Notice of Allowance and Fee(s) Due from the USPTO dated May 2004 relating to U.S. Appl. No. 10/267,531.
Tieu, Notice of Allowance and Fee(s) Due from the USPTO dated Jul. 2008 relating to U.S. Appl. No. 11/582,206.
Tieu, Notice of Allowance and Fee(s) Due from the USPTO dated Jun. 2006 relating to U.S. Appl. No. 10/922,135.
Tran, Notice of Allowance and Fee(s) Due from the USPTO dated Jun. 2010 relating to U.S. Appl. No. 11/501,125.
Tieu, Notice of Allowance and Fee(s) Due from the USPTO dated Apr. 2010 relating to U.S. Appl. No. 11/347,014.
Tieu, Notice of Allowance and Fee(s) Due from the USPTO dated Dec. 2008 relating to U.S. Appl. No. 11/127,520.
Luu, Notice of Allowance and Fee(s) Due from the USPTO dated Jul. 2009 relating to U.S. Appl. No. 11/351,342.
Miyajima, Notice of Reasons for Refusal from the Japanese Patent Office dated Feb. 2006 relating to appln. No. 2003-535287.
Newman, "Radiation Hardened Power Electronics", Intersil Corporation, 1999, pp. 1-4.
Karandikar, et al., "Technology Mapping for SOI Domino Logic Incorporating Solutions for the Parasitic Bipolar Effect", ACM, 2001, pp. 1-14.
Makioka, et al., "Super Self Aligned GaAs RF Switch IC with 0.25dB Extremely Low Insertion Loss for Mobile Communication Systems", IEEE Transactions on Electron Devices, vol. 48, No. 8, Aug. 2001, pp. 1510-1514.
Maeda, et al., "Substrate Bias Effect and Source Drain Breakdown Characteristics in Body Tied Short Channel SOI MOSFETs", IEEE Transactions on Electron Devices, vol. 46, No. 1, Jan. 1999, pp. 151-158.
Sanders, "Statistical Modeling of SOI Devices for the Low Power Electronics Program", AET, Inc., 1995, pp. 1-109.
Baker, et al., "Stacking Power MOSFETs for Use in High Speed Instrumentation", American Institute of Physics, 1992, pp. 5799-5801.
Kelly, Response and Terminal Disclaimer filed in the USPTO dated Mar. 2010 relating to U.S. Appl. No. 11/347,014.

(56) References Cited

OTHER PUBLICATIONS

Burgener, et al., Response filed in the USPTO dated May 2006 relating to U.S. Appl. No. 10/922,135.
Kelly, Response to Office Action mailed to USPTO relating to U.S. Appl. No. 11/351,342 dated Jan. 30, 2009.
"RF & Microwave Device Overview 2003—Silicon and GaAs Semiconductors", NEC, 2003.
"RF Amplifier Design Using HFA3046, HFA3096, HFA3127, HFA3128 Transistor Arrays", Intersil Corporation, 1996, pp. 1-4.
Kuang, et al., "SRAM Bitline Circuits on PD SOI: Advantages and Concerns", IEEE Journal of Solid State Circuits, vol. 32, No. 6, Jun. 1997.
Caverly, et al., "SPICE Modeling of Microwave and RF Control Diodes", IEEE, 2000, pp. 28-31.
Kusunoki, et al., "SPDT Switch MMIC Using E/D Mode GaAs JFETs for Personal Communications", IEEE GaAs IC Symposium, 1992, pp. 135-138.
Fukuda, et al., "SOI CMOS Device Technology", OKI Technical Review, 2001, pp. 54-57.
Fukuda, et al., "SOI CMOS Device Technology", Special Edition on 21st Century Solutions, 2001, pp. 54-57.
Rozeau, "SOI Technologies Overview for Low Power Low Voltage Radio Frequency Applications", Analog Integrated Circuits and Signal Processing, Nov. 2000, pp. 93-114.
Chung, et al., "SOI MOSFET Structure with a Junction Type Body Contact for Suppression of Pass Gate Leakage", IEEE Transactions on Electron Devices, vol. 48, No. 7, Jul. 2001.
Stuber, et al., "SOI CMOS with High Performance Passive Components for Analog, RF and Mixed Signal Designs", IEEE International SOI Conference, 1998, pp. 99-100.
"SA630 Single Pole Double Throw (SPDT) Switch", Philips Semiconductors, 1997.
Narendra, et al., "Scaling of Stack Effects and its Application for Leakage Reduction", ISLPED 2001, 2001, pp. 195-200.
Huang, "Schottky Clamped MOS Transistors for Wireless CMOS Radio Frequency Switch Application", University of Florida, 2001, pp. 1-167.
Reedy, et al., "Single Chip Wireless Systems Using SOI", IEEE International SOI Conference, 1999, pp. 8-11.
Botto, et al., "Series Connected Soft Switched IGBTs for High Power, High Voltage Drives Applications: Experimental Results", IEEE, 1997, pp. 3-7.
Baker, et al., "Series Operation of Power MOSFETs for High Speed Voltage Switching Applications", American Institute of Physics, 1993, pp. 1655-1656.
Lovelace, et al., "Silicon MOSFET Technology for RF ICs", IEEE, 1995, pp. 1238-1241.
Rodgers, et al., "Silicon UTSi CMOS RFIC for CDMA Wireless Communications System", IEEE MTT-S Digest, 1999, pp. 485-488.
"Silicon Wave SiW1502 Radio Modem IC", Silicon Wave, 2000, pp. 1-21.
Johnson, et al., "Silicon-On-Sapphire MOSFET Transmit/Receive Switch for L and S Band Transceiver Applications", Electronic Letters, 1997, pp. 1324-1326.
Huang, et al., "TFSOI Can It Meet the Challenge of Single Chip Portable Wireless Systems", IEEE International SOI Conference, 1997, pp. 1-3.
Wang, et al., "Efficiency Improvement in Charge Pump Circuits", IEEE Journal of Solid-State Circuits, vol. 32, No. 6, Jun. 1997, pp. 852-860.
Montoriol, et al., "3.6V and 4.8V GSM/DCS1800 Dual Band PA Application with DECT Capability Using Standard Motorola RFICs", 2000, pp. 1-20.
Devlin, "The Design of Integrated Switches and Phase Shifters", 1999.
Hittite Microwave, "Wireless Symposium 2000 is Stage for New Product Introductions", Hittite Microwave, 2000, pp. 1-8.
Reedy, et al., "UTSi CMOS: A Complete RF SOI Solution", Peregrine Semiconductor, 2001, pp. 1-6.

"uPG13xG Series L-Band SPDT Switch GaAs MMIC", NEC, 1996, pp. 1-30.
Hess, et al., "Transformerless Capacitive Coupling of Gate Signals for Series Operation of Power MOS Devices", IEEE, 1999, pp. 673-675.
Ajjkuttira, et al., "A Fully Integrated CMOS RFIC for Bluetooth Applications", IEEE International Solid-State Circuits Conference, 2001, pp. 1-3.
Apel, et al., "A GaAs MMIC Transceiver for 2.45 GHz Wireless Commercial Products", Microwave and Millimeter-Wave Monolithic Circuits Symposium, 1994, pp. 15-18.
Assaderaghi, et al., "Dynamic Threshold Voltage MOSFET (DTMOS) for Ultra Low Voltage VLSI", IEEE Transactions on Electron Devices, vol. 44, No. 3, Mar. 1997, pp. 414-422.
Bolam, et al., "Reliability Issues for Silicon-on-Insulator", IEEE, 2000, pp. 6.4.1-6.4.4.
Bolam, et al., "Reliability Issues for Silicon-on-Insulator", IBM Micro Electronics Division, IEEE 2000, pp. 6.4.1-6.4.4.
Caverly, et al., "CMOS RF Circuits for Integrated Wireless Systems", IEEE, 1998, pp. 1-4.
Chao, et al., "High-Voltage and High-Temperature Applications of DTMOS with Reverse Schottky Barrier on Substrate Contacts", vol. 25, No. 2, Feb. 2004, pp. 86-88.
Devlin, et al., "A 2.4 GHz Single Chip Transceiver", Microwave and Millimeter-Wave Monolithic Circuits Symposium, 1993, pp. 23-26.
Fiorenza, et al., "RF Power Performance of LDMOSEETs on SOI: An Experimental Comparison with Bulk Si MOSFETs", IEEE Radio Frequency Integrated Circuits Symposium, 2001, pp. 43-46.
Giffard, et al., "Dynamic Effects in SOI MOSEETs", IEEE SOS/SOI Technology Conference, Oct. 1991, pp. 160-161.
Hirano, et al., "Impact of Actively Body-Bias Controlled (ABC) SOI SRAM by Using Direct Body Contact Technology for Low-Voltage Applications", IEEE, 2003, pp. 2.4.1-2.4.4.
Imai, et al., "Novel High Isolation FET Switches", IEEE Transactions on Microwave Theory and Techniques, 1996, pp. 685-691.
Ishida, et al., "A Low Power GaAs Front End IC with Current Reuse Configuration Using 0.15um Gate GaAs MODEETs", IEEE, 1997, pp. 669-672.
Iwata, et al., "Gate Over Driving CMOS Architecture for 0.5V Single Power Supply Operated Devices", IEEE, 1997, pp. 290-291, 473.
Kumar, et al., "A Simple High Performance Complementary TFSOI BiCMOS Technology with Excellent Cross-Talk Isolation", 2000 IEEE International SOI Conference, 2000, pp. 142-143.
Kwok, "An X-Band SOS Resistive Gate Insulator Semiconductor (RIS) Switch", IEEE Transactions on Electron Device, 1980, pp. 442-448.
Lee, et al., "Effect of Body Structure on Analog Performance of SOI NMOSFETs", 1998 IEEE International SOI conference, Oct. 1998, pp. 61-62.
Lee, "CMOS RF: (Still) No Longer an Oxymoron (Invited)", IEEE Radio Frequency Integrated Circuits Symposium, 1999, pp. 3-6.
Madihian, et al., "A 2-V, 1-10GHz BiCMOS Transceiver Chip for Multimode Wireless Communications Networks", IEEE, 1997, pp. 521-525.
McRory, et al., "Transformer Coupled Stacked FET Power Amplifier", IEEE Journal of Solid State Circuits, vol. 34, No. 2, Feb. 1999, pp. 157-161.
Nagayama, et al., "Low Insertion Los DP3T MMIC Switch for Dual Band Cellular Phones", IEEE Jounral of Solid State Circuits, 1999, pp. 1051-1055.
Nishijima, et al., "A High Performance Transceiver Hybrid IC for PHS Hand Set Operating with Single Positive Voltage Supply", Microwave Symposium Digest, 1997, pp. 1155-1158.
O, et al., "CMOS Components for 802.11b Wireless LAN Applications", IEEE Radio Frequency Integrated Circuits Symposium, 2002, pp. 103-106.
Peczalski, "RF/Analog/Digital SOI Technology GPS Receivers and Other Systems on a Chip", IEEE Aerospace Conference Proceedings, 2002, pp. 2013-2017.

(56) References Cited

OTHER PUBLICATIONS

Shifrin, et al., "A New Power Amplifier Topology with Series Biasing and Power Combining of Transistors", IEEE 1992 Microwave and Millimeter-Wave Monolithic Circuits Symposium, 1992, pp. 39-41.
Shimura, et al., "High Isolation V-Band SPDT Switch MMIC for High Power Use", IEEE MTT-S International Microwave Symposium Digest, 2001, pp. 245-248.
Uda, et al., "A High Performance and Miniturized Dual Use (antenna/local) GaAs SPDT Switch IC Operating at +3V/0V", Microwave Symposium Digest, 1996, pp. 141-144.
Uda, et al., "High Performance GaAs Switch IC's Fabricated Using MESFETs with Two Kinds of Pinch Off Voltages and a Symmetrical Pattern Configuration", IEEE Journal of Solid-State Circuits, 1994, pp. 1262-1269.
Lee, et al., "Analysis of Body Bias Effect with PD-SOI for Analog and RF Application", Solid State Electron, vol. 46, 2002, pp. 1169-1176.
Ippoushi, "SOI Structure Avoids Increases in Chip Area and Parasitic Capacitance Enables Operational Control of Transistor Threshold Voltage", Renesas Edge, vol. 2004.5, Jul. 2004, p. 15.
Park, "A Regulated, Charge Pump CMOS DC/DC Converter for Low Power Application", 1998, pp. 1-62.
Hittite Microwave, Floating Ground SPNT MMIC Switch Driver Techniques, 2001.
Caverly, et al., "Gallium Nitride-Based Microwave and RF Control Devices", 2001.
Sedra, et al., "Microelectronic Circuits", University of Toronto, Oxford University Press, Fourth Edition, 1982,1987,1991,1998, pp. 374-375.
Bahl, "Lumped Elements for RF and Microwave Circuits", Artech House, 2003, pp. 353-394.
"Positive Bias GaAs Multi-Throw Switches with Integrated TTL Decoders", Hittite Microwave, 2000.
Hiramoto, Toshiro, et al., "Low Power and Low Voltage MOSFETs with Variable Threshold Voltage Controlled by Back-Bias", IEICE Trans. Electron, vol. E83-C, No. 2, Feb. 2000, pp. 161-169.
Drozdovsky, et al., "Large Signal Modeling of Microwave Gallium Nitride Based HFETs", Asia Pacific Microwave Conference, 2001, pp. 248-251.
Ayasli, "Microwave Switching with GaAs FETs", Microwave Journal, 1982, pp. 719-723.
Eron, "Small and Large Signal Analysis of MESETs as Switches" Microwave Journal, 1992.
"A Voltage Regulator for GaAs FETs", Microwave Journal, 1995.
Slobodnik, et al., "Millimeter Wave GaAs Switch FET Modeling", Microwave Journal, 1989.
Caverly, "Distortion in GaAs MESFET Switch Circuits", 1994.
Chen, et al., "Dual-Gate GaAs FET: A Versatile Circuit Component for MMICs", Microwave Journal, Jun. 1989, pp. 125-135.
Bullock, "Transceiver and System Design for Digital Communication", Noble, 2000.
Crols, "CMOS Wireless Transceiver Design", Kluwer Academic, 1997.
Hickman, "Practical RF Handbook", Newnes, 1997.
Hagen, "Radio Frequency Electronics", Cambridge University Press, 1996.
Koh, et al., "Low-Voltage SOI CMOS VLSI Devices and Circuits", Wiley Interscience, XP001090589, New York, 2001, pp. 57-60, 349-354.
Leenaerts, "Circuits Design for RF Transceivers" Kluwer Academic, 2001.
Johnson, "Advanced High-Frequency Radio Communication", Artech House, 1997.
Larson, "RF and Microwave Circuit Design for Wireless Communications", Artech House, 1996.
Misra, "Radio Frequency and Microwave Communication Circuits", Wiley, 2001.
NEC Corporation, "uPG13xG Series L-Band SPDT Switch GaAs MMIC", Document No. P1096EJ1VOANDO (1st Edition), Feb. 1996, 30 pgs.
Pozar, "Microwave and RF Design of Wireless Systems", Wiley, 2001.
Maas, "The RF and Microwave Circuit Design Cookbook", Artech House, 1998.
Smith, "Modern Communication Systems", McGraw-Hill, 1998.
Van Der Pujie, "Telecommunication Circuit Design", Wiley, 2002.
Razavi, "RF Microelectronics", Prentice-Hall, 1998.
Van Der Pujie, "Telecommunication Circuit Design", Wiley, 1992.
Weisman, "The Essential Guide to RF and Wireless", Prentice-Hall, 2000.
Wetzel, "Silicon-on-Sapphire Technology for Microwave Power Application", University of California, San Diego, 2001.
Johnson, "Silicon-on-Sapphire Technology for Microwave Circuit Applications", Dissertation, UCSD, 1997, pp. 1-184.
Barker, Communications Electronics-Systems, Circuits, and Devices, 1987, Prentice-Hall.
Carr, "Secrets of RF Circuit Design", McGraw-Hill, 1997.
Couch, "Digital and Analog Communication Systems", 2001, Prentice-Hall.
Couch, "Modern Telecommunication System", Prentice-Hall, 1995.
Freeman, "Radio System esign for Telecommunications", Wiley, 1997.
Gibson, "The Communication Handbook", CRC Press, 1997.
Hanzo, "Adaptive Wireless Transceivers", Wiley, 2002.
Itoh, "RF Technologies for Low Power Wireless Communications", Wiley, 2001.
Lossee, "RF Systems, Components, and Circuits Handbook", Artech House, 1997.
Miller, "Modem Electronic Communications", Prentice-Hall, 1999.
Minoli, "Telecommunications Technology Handbook", Artech House, 2003.
Morreale, "The CRC Handbook of Modern Telecommunication", CRC Press, 2001.
Sayre, "Complete Wireless Design", McGraw-Hill, 2001.
Schaper, "Communications, Computations, Control, and Signal Processing", Kluwer Academic, 1997.
Shafi, "Wireless Communications in the 21st Century", Wiley, 2002.
Nguyen, Niki Hoang, Office Action received from the USPTO dated Sep. 26, 2012 for related U.S. Appl. No. 13/277,108, 47 pgs.
Nishide, Ryuji, Translation of Japanese Office Action received from the JP dated Jul. 17, 2012 for related appln. No. 2008-521544, 4 pgs.
"An Ultra-Thin Silicon Technology that Provides Integration Solutions on Standard CMOS", Peregrine Semiconductor, 1998.
Caverly, "Distortion in Microwave Control Devices", 1997.
Masuda, et al., "RF Current Evaluation of ICs by MP-10L", NEC Research & Development, vol. 40-41, 1999, pp. 253-258.
"Miniature Dual Control SP4T Switches for Low Cost Multiplexing", Hittite Microwave, 1995.
Uda, "Miniturization and High Isolation of a GaAs SPDT Switch IC Mounted in Plastic Package", 1996.
Marshall, et al., "SOI Design: Analog, Memory, and Digital Techniques", Kluwer Academic Publishers, 2002.
Bernstein, et al., "SOI Circuit Design Concepts", Springer Science + Business Media, 2000.
Brinkman, et al., Respondents' Notice of Prior Art, Investigation No. 337-TA-848, dated Aug. 31, 2012, 59 pgs.
Willert-Porada, M. "Advanced in Microwave and Radio Frequency Processing", 8th International Cnference of Microwave and High-Frequency Heating, Springer, Oct. 2009.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999.
Gonzalez, Brosa A., Decision to Grant a European Patent Pursuant to Article 97(1) EPC received from the EPO dated Nov. 2, 2012 for related appln. No. 09715932.1, 1 pg.
Simon, Volker, Communication Pursuant to Article 94(3) EPC received from the EPO dated Nov. 16, 2012 for related appln. No. 09174085.2, 8 pgs.

(56) References Cited

OTHER PUBLICATIONS

Le, Dinh Thanh, Office Action received from the USPTO dated Nov. 20, 2012 for related U.S. Appl. No. 12/803,064, 6 pgs.
Patel, Reema, Notice of Allowance received from the USPTO dated Dec. 3, 2012 for related U.S. Appl. No. 13/046,560, 9 pgs.
Japanese Patent Office, Notice of Allowance received from the Japanese Patent Office dated Dec. 17, 2012 for related appln. No. 2010-506156, 3 pgs.
Brosa, Anna-Maria, European Search Report received from the EPO dated Feb. 1, 2013 for related appln. No. EP12194187, 10 pgs.
Lauterbach, et al., "Charge Sharing Concept and New Clocking Scheme for Power Efficiency and Electromagnetic Emission Improvement of Boosted Charge Pumps", IEEE Journal of Solid-State Circuits, vol. 35, No. 5, May 2000, pp. 719-723.
Ranta, et al., Response filed in USPTO dated May 20, 2013 for related U.S. Appl. No. 12/803,139, 8 pgs.
Peregrine Semiconductor Corporation, Response filed in EPO dated May 23, 2013 for related appln. No. 09174085.2, 16 pgs.
Utagawa, Tsutomu, Office Action received from the JPO dated Jun. 4, 2013 for related appln. No. 2010-548750, 3 pgs.
Englekirk, Robert Mark, Part B—Fee(s) Transmittal and Comments on Examiner's Statement of Reasons for Allowance filed in USPTO dated Jun. 17, 2013 for related U.S. Appl. No. 13/046,560, 4 pgs.
Rojas, Daniel E., Office Action received from USPTO dated Jun. 17, 2013 for related U.S. Appl. No. 12/803,139, 36 pgs.
Le, Dinh Thanh, Notice of Allowance received from the USPTO dated Jul. 18, 2013 for related U.S. Appl. No. 12/803,064, 12 pgs.
Cole, Brandon S., Notice of Allowance received from the USPTO dated Jul. 30, 2013 for related U.S. Appl. No. 12/803,133, 136 pgs.
Peregrine Semiconductor Corporation, Response and English Translation filed in Japanese Patent Office dated Sep. 4, 2013 for related appln. No. 2010-548750, 11 pgs.
Peregrine Semiconductor Corporation, Response filed in the EPO dated Sep. 11, 2013 for related appln. No. 1219418.6, 16 pgs.
Ranta, et al., Response filed in the USPTO dated Sep. 17, 2013 for related U.S. Appl. No. 12/803,139, 14 pgs.
Simon, Volker, Communication pursuant to Article 94(3) EPC received from the Epo dated Sep. 24, 2013 for related appln. No. 07794407.2, 5 pgs.
Rojas, Daniel E., Notice of Allowance received from the USPTO dated Oct. 22, 2013 for related U.S. Appl. No. 12/803,139, 142 pgs.
Funakoshi, Ryo, Office Action and English translation received from the JPO dated Oct. 29, 2013 for related appln. No. 2013-006353, 15 pgs.
Theunissen, Lars, Communication under Rule 71(3) EPC received from the EPO dated Nov. 12, 2013 for related appln. No. 12194187.6, 94 pgs.
Gonzales, Brosa, Decision to Grant a European patent pursuant to Article 97(1) EPC received from the EPO dated Jan. 17, 2014 for related appln. No. 12194187.6, 1 pg.
Peregrine Semiconductor Corporation, Response and English translation filed in the JPO dated Apr. 28, 2014 for related appln. No. 2013-006353, 22 pgs.
European Patent Office, Noting of Loss of Rights Pursuant to Rule 112(1) EPC dated May 2, 2014 for related appln. No. 07794407.2, 1 pg.
Brosa, Anna-Maria, Extended Search Report received from the EPO dated May 27, 2014 for related appln. No. 14165804.7, 8 pgs.
Sjoblom, et al., "An Adaptive Impedance Tuning CMOS Circuit for ISM 2.4-GHz Band", IEEE Transactions on Circuits and Systems-I: Regular Papers, vol. 52, No. 6, Jun. 2005, pp. 1115-1124.
Ranta, et al., "Devices and Methods for Improving Voltage Handling and/or Bi-Directionality of Stacks of Elements When Connected Between Terminals", related application filed in the USPTO on Feb. 11, 2014, U.S. Appl. No. 14/178,116, 56 pgs.
Ranta, et al., "Devices and Methods for Improving Voltage Handling and/or Bi-Directionality of Stacks of Elements When Connected Between Terminals", related application filed in the USPTO on Jan. 27, 2014, U.S. Appl. No. 14/165,422, 60 pgs.
Rojas, Daniel E., Office Action received from the USPTO dated Aug. 12, 2014 for related U.S. Appl. No. 14/178,116, 9 pgs.
Patel, Reema, Office Action received from the USPTO dated Aug. 15, 2014 for related U.S. Appl. No. 14/028,357, 8 pgs.
Japanese Patent Office, Notice of Allowance received from the JPO dated Jul. 8, 2014 for related appln. No. 2013-006353, 3 pgs.
Peregrine Semiconductor Corporation, Response filed in the EPO on Jul. 11, 2014 for related appln. No. 07794407.2, 32 pgs.
European Patent Office, Communication pursuant to Rule 58 EPC received from the EPO dated Jul. 21, 2014 for related appln. No. 07794407.2, 5 pgs.
Peregrine Semiconductor Corporation, Response filed in the EPO on Jul. 31, 2014 for related appln. No. 07794407.2, 25 pgs.
Wang, Chi-Chang, et al., "Efficiency Improvement in Charge Pump Circuits", IEEE Journal of Solid-State Circuits, vol. 32, No. 6, Jun. 1997, pp. 852-860.
Yamamoto, Kazuya, et al., "A 2.2-V Operation, 2.4-GHz Single-Chip GaAs MMIC Transceiver for Wireless Applications", IEEE Journal of Solid-State Circuits, vol. 34, No. 4, Apr. 1999, pp. 502-512.
Su, Pin, et al., "On the Body-Source Built-In Potential Lowering of SOI MOSFETs", IEEE Electron Device Letters, vol. 24, No. 2, Feb. 2003, pp. 90-92.
Yang, Min, "Sub-100nm Vertical MOSFET's with Si1-x-y GexCy Source/Drains", a dissertation presented to the faculty of Princeton University, Jun. 2000, 272 pgs.
Ytterdal, T., et al., "MOSFET Device Physics and Operation", Device Modeling for Analog and RF CMOS Circuit Design, 2003 John Wiley & Sons, Ltd., 46 pgs.
Wong, Alan, Office Action received from the USPTO dated Sep. 12, 2014 for related U.S. Appl. No. 13/595,893, 11 pgs.
Ranta, et al., Response filed in the USPTO dated Nov. 12, 2014 for U.S. Appl. No. 14/178,116, 8 pgs.
Ichikawa, Takenori, Office Action and English translation received from the JPO dated Nov. 18, 2014 for appln. No. 2013-181032, 15 pgs.
Cherne, et al., "SOI CMOS Device Having Body Extension for Providing Sidewall Channel Stop and Bodytie", Reg. No. H1435, published May 2, 1995.
Rojas, Daniel S., Office Action received from the USPTO dated Feb. 21, 2013 for U.S. Appl. No. 12/803,139, 7 pgs.
Rojas, Daniel S., Notice of Allowance received from the USPTO dated Mar. 31, 2015 for U.S. Appl. No. 14/178,116, 18 pgs.
Puentes, Daniel Calrissian, Office Action received from the USPTO dated May 10, 2016 for U.S. Appl. No. 14/814,404, 8 pgs.
Puentes, Daniel Calrissian, Office Action received from the USPTO dated Feb. 1, 2017 for U.S. Appl. No. 14/814,404, 13 pgs.
Puentes, Daniel Calrissian, Notice of Allowance received from the USPTO dated May 3, 2017 for U.S. Appl. No. 14/814,404, 29 pgs.
Ranta, et al., Response filed in the USPTO dated Nov. 7, 2016 for U.S. Appl. No. 14/814,404, 8 pgs.
Ranta, et al., Response filed in the USPTO dated Feb. 24, 2017 for U.S. Appl. No. 14/814,404, 4 pgs.
Ranta, et al., "Devices and Methods for Improving Voltage Handling and/or Bi-Directionality of Stacks of Elements when Connected Between Terminals", patent application filed in the USPTO on Feb. 24, 2017, U.S. Appl. No. 15/442,491, 55 pgs.
Copenheaver, Blaine, International Search Report and Written Opinion received from the USRO dated May 27, 2009, 11 pgs.
Peregrine Semiconductor Corporation, Article 19 Amendment Letter under Seciton 205(b) and Rule 46.5(b) PCT filed in the International Bureau of WIPO dated Aug. 11, 2009 for appln. No. PCT/US2009/001358.
Dang, Hung Q., Office Action received from the USPTO dated Dec. 22, 2011 for U.S. Appl. No. 12/735,954, 32 pgs.
Ranta, Tero Tapia, Amendment filed in the USPTO dated Mar. 21, 2012 for U.S. Appl. No. 12/735,954, 16 pgs.
Dang, Hung Q., Notice of Allowance received from the USPTO dated Jul. 12, 2012 for U.S. Appl. No. 12/735,954, 20 pgs.
Dang, Hung Q., Notice of Allowance received from the USPTO dated Oct. 1, 2012 for U.S. Appl. No. 12/735,954, 67 pgs.
Ranta, Tero Tapia, Amendment filed in the USPTO dated Jun. 26, 2014 for U.S. Appl. No. 12/735,954, 33 pgs.

(56) References Cited

OTHER PUBLICATIONS

Dang, Hung Q., Notice of Allowance received from the USPTO dated Jan. 25, 2013 for U.S. Appl. No. 12/735,954, 42 pgs.
Dang, Hung Q., Notice of Allowance received from the USPTO dated May 10, 2013 for U.S. Appl. No. 12/735,954, 22 pgs.
Dang, Hung Q., Notice of Allowance received from the USPTO dated Sep. 13, 2013 for U.S. Appl. No. 12/735,954, 16 pgs.
Ranta, Tero Tapia, Amendment filed in the USPTO dated Dec. 13, 2013 for U.S. Appl. No. 12/735,954, 29 pgs.
Dang, Hung Q., Office Action received from the USPTO dated Feb. 26, 2014 for U.S. Appl. No. 12/735,954, 34 pgs.
Dang, Hung Q., Notice of Allowance received from the USPTO dated Nov. 18, 2014 for U.S. Appl. No. 12/735,954, 33 pgs.
Kao, W.H., et al., "Parasitic extraction: current state of the art and future trends", Proceedings of the IEEE, May 2001, vol. 89, Issue 5, pp. 729-739.
Brambilla, A., et al., "Measurements and extractions of parasitic capacitances in ULSI layouts", Electron Devices, IEEE Transactions, Nov. 2003, vol. 50, Issue 11, pp. 2236-2247.
Xu, et al., "An efficient formulation for substrate parasitic extraction accounting for nonuniform current distribution", Circuits and Systems I: Regular papers, IEEE Transactions, Jun. 2004, vol. 51, Issue 6, pp. 1223-1233.
Nabors, et al., "FastCap: A Multipole Accelerated 3-D Capacitance Extraction Program", IEEE Transactions on Computer-Aided Design, vol. 10, No. 11, Nov. 1991, pp. 1447-1459.
Nabors, et al., "Fast Capacitance Extraction of General Three-Dimensional Structures", IEEE Transactions on Microwave Theory and Techniques, vol. 40, No. 7, Jul. 1992, pp. 1496-1506.
Nabors, et al., "Multipole-Accelerated Capacitance Extraction Algorithms for 3-D Structures with Multiple Dielectrics" IEEE Transactions on Circuit and Systems, 1: Fundamental Theory and Applications, vol. 39, No. 11, Nov. 1992, pp. 946-954.
Tausch, et al., "Capacitance Extraction of 3-D Conductor Systems in Dielectric Media with High-Permittivity Ratios", IEEE Transactions on Microwave Theory and Techniques, vol. 47, No. 1, Jan. 1999, pp. 18-26.
Nabors, et al., "A Fast Multipole Algorithm for Capacitance Extraction of Complex 3-D Geometries", IEEE 1989 Custom Integrated Circuits Conference, May 1989, pp. 21.7.1-21.7.4.
Nabors, et al., "Fast Capacitance Extraction of General Three-Dimensional Structures", Proc. Int. Conf. on Computer Design, Cambridge, MA, Oct. 1991, pp. 479-484.
Nabors, et al., "Including Conformal Dielectrics in Multipole-Accelerated Three-Dimensional Interconnect Capacitance Extraction", proceedings of NUPAD IV, Seattle, WA, May 1992, 2 pgs.
Nabors et al., "Multipole-Accelerated 3-D Capacitance Extraction Algorithms for Structures with Conformal Dielectrics", Proceeding of the 29th Design Automation Conference, Anaheim, CA, Jun. 1992, pp. 710-715.
Phillips, et al., "A Precorrected-FFT method for Capacitance Extraction of Complicated 3-D Structures", Int. Conf. On Computer-Aided Design, Santa Clara, CA, Nov. 1994, 4 pgs.
Phillips, et al., "Efficient Capacitance Extraction of 3D Structures Using Generalized Pre-Corrected FFT Methods", Proceedings of the IEEE 3rd Tropical Meeting on Electrical Performance of Electronic Packaging, Monterey, CA, Nov. 1994, 3 pgs.
Cai, et al., "Efficient Galerkin Techniques for Multipole-Accelerated Capacitance Extraction of 3-D Structures with Multiple Dielectrics" Proceedings of the 16th Conference on Advanced Research in VLSI, Chapel Hill, North Carolina, Mar. 1995, 12 pages.
Kamon, et al., "FastPep: A Fast Parasitic Extraction Program for Complex Three-Dimensional Geometries", Proceedings of the IEEE Conference on Computer-Aided Design, San Jose, Nov. 1997, pp. 456-460.
Young, Lee W., International Search Report received from USRO for related appln. No. PCT/US2007/10331 dated Feb. 15, 2008, 14 pages.
Patel, Reema, Notice of Allowance received from the USPTO for related U.S. Appl. No. 11/796,522, dated Jan. 28, 2011, 9 pgs.
Le, Dinh Thanh, Office Action received from the USPTO dated Jun. 23, 2011 for related U.S. Appl. No. 12/803,064, 16 pgs.
Brosa, Anna-Maria, extended European Search Report received from the EPO dated Jul. 15, 2011 for related application No. 09715932.1, 12 pgs.
Le Dinh Thanh, Office Action received from the USPTO dated Dec. 1, 2011 for related U.S. Appl. No. 12/803,064, 23 pgs.
Patel, Reema, Office Action received from the USPTO dated Dec. 5, 2011 for related U.S. Appl. No. 13/046,560, 13 pgs.
Peregrine Semiconductor Corporation, Response filed in the EPO dated Feb. 10, 2012 for related appln. No. 09715932.1, 47 pgs.
Cole, Brandon S., Office Action received from the USPTO dated Feb. 24, 2012 for related U.S. Appl. No. 12/803,133, 36 pgs.
Kurisu, Masakazu, Japanese Office Action and translation received from the JPO dated Apr. 17, 2012 for related appln. No. 2010-506156, 4 pgs.
Ranta, et al., Amendment filed in USPTO dated Apr. 30, 2012 for related U.S. Appl. No. 12/803,064, 16 pgs.
Ranta, et al., Response filed in the USPTO dated May 23, 2012 for related U.S. Appl. No. 12/803,133, 7 pgs.
Patel, Reema, Notice of Allowance received from the USPTO dated May 24, 2012 for related U.S. Appl. No. 13/046,560, 15 pgs.
Englekirk, Robert Mark, Amendment filed in the USPTO dated Mar. 5, 2012 for related U.S. Appl. No. 13/046,560, 4 pgs.
Cole, Brandon S., Notice of Allowance received from the USPTO dated Jun. 8, 2012 for related U.S. Appl. No. 12/803,133, 12 pgs.
Le, Dinh Thanh, Office Action received from the USPTO dated Jun. 13, 2012 for related U.S. Appl. No. 12/803,064, 14 pgs.
Theunissen, Lars, Communication under Rule 71(3) EPC dated Jul. 2, 2012 for related appln. No. 09715932.1, 98 pgs.
Ranta, et al., Comments on Examiner's Statement of Reasons for Allowance filed in the USPTO dated Sep. 10, 2012 for related U.S. Appl. No. 12/803,133, 3 pgs.
Ranta, et al., Amendment filed in the USPTO dated Sep. 12, 2012 for related U.S. Appl. No. 12/803,064, 13 pgs.

* cited by examiner

POSITIVE LOGIC DIGITALLY TUNABLE CAPACITOR

CROSS REFERENCE TO RELATED APPLICATIONS

The present application is related to PCT Patent International Application No. PCT/US2009/001358 filed Mar. 2, 2009, entitled "Method and Apparatus for use in Digitally Tuning a Capacitor in an Integrated Circuit Device" incorporated herein by reference in its entirety. This application is also related to U.S. application Ser. No. 12/803,139 filed Jun. 18, 2010, entitled "Device and Methods for Improving Voltage Handling and/or Bi-directionality of Stacks of Elements when Connected Between Terminals", issued as U.S. Pat. No. 8,669,804 on Mar. 11, 2014, also incorporated herein by reference in its entirety.

TECHNICAL FIELD

The present disclosure relates to integrated circuit devices, and more particularly to a method and apparatus for digitally tuning the capacitance of integrated circuit components in integrated circuit devices that use positive logic for DC biasing purpose.

SUMMARY

According to a first aspect of the present disclosure, an integrated circuit block is provided, comprising: a first node; a second node; a resistive network, and a series arrangement of two or more capacitors and a plurality of FET switches coupled between the first node and the second node; wherein: a first capacitor of the two or more capacitors is coupled to the first node and a second capacitor of the two or more capacitors is coupled to the second node; the plurality of FET switches comprises a first end FET switch and a second end FET switch, the first end FET switch being closest to the first node and farthest from the second node and the second end FET switch being closest to the second node and farthest from the first node; each FET switch comprises a gate resistor connecting a FET switch gate to a first supply voltage; the resistive network comprises a plurality of resistive paths connecting a second supply voltage to drains of corresponding FET switches; the resistive network further comprises a resistive path connecting the second supply voltage to a source of the second end FET switch, and wherein the first supply voltage and the second supply voltage are configured to enable or disable the FET switches and thereby adjusting the capacitance between the two nodes.

According to a second aspect of the present disclosure, a method for digitally tuning a capacitor in an integrated circuit is disclosed, providing: providing a first node; providing a second node; providing a series arrangement of two or more capacitors and a plurality of FET switches; the plurality of FET switches comprising a first end FET switch and a second end FET switch, the first end FET switch being the closest to the first node and farthest from the second node and the second end FET switch being closest to the second node and farthest from the first node, and each of the plurality of FET switches comprising a gate resistor; providing a resistive network, the resistive network comprising: a plurality of resistive paths connecting a second supply voltage to drains of corresponding FET switches of the plurality of FET switches; a resistive path connecting the second supply voltage to a source of the end FET switch; connecting each of the FET switches from the plurality of the FET switches to a first supply voltage via a corresponding gate resistor; coupling the series arrangement of two or more capacitors and the plurality of FET switches between the first node and the second node; coupling a first capacitor of the two or more capacitors to the first node and coupling a second capacitor of the two or more capacitors to the second node, and enabling or disabling the FET switches using the first supply voltage and the second supply voltage and thereby adjusting the capacitance between the two nodes.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION OF THE INVENTION

Figure 1:
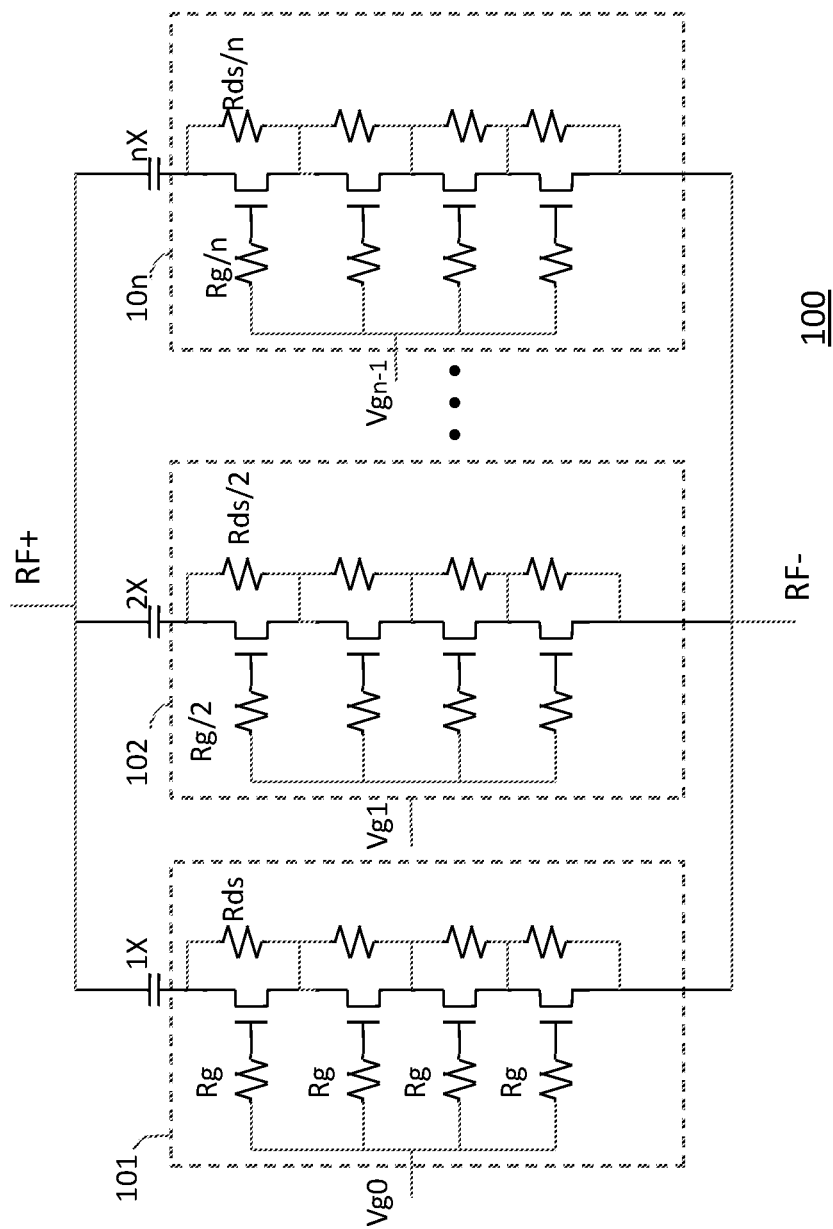
FIG. 1 shows an example of a digitally tunable capacitor circuit as disclosed in PCT Patent Application PCT/US2009/001358 incorporated herein by reference in its entirety.

FIG. 1 shows an example of a digitally tuned capacitor (hereafter, "DTC") circuit as disclosed in PCT Patent Application PCT/US2009/001358 incorporated herein by reference in its entirety. The circuit of FIG. 1 comprises a plurality of sub-circuits 101, 102, . . . , 10n, configured in parallel. Each sub-circuit comprises a plurality of stacked switching FETs coupled in series with their associated capacitance. A standard biasing scheme is usually used in this type of circuit wherein a positive voltage (applied to the gate of each FET) is applied to turn the stack ON and a negative voltage (applied to the gate of each FET) is used to turn the stack OFF. By way of example, a positive DC voltage of +3 volts may be applied (through the resistors Rg) to the gates of each FET in the sub-circuit 101 to turn the stack ON and a negative DC voltage of −3 volts may be applied (through the resistors Rg) to the gates of each FET in the sub-circuit 101 to turn the stack OFF.

In order to achieve an improved RF performance in designs using the above mentioned DTC, a large enough negative voltage to turn fully the FET switch OFF is highly desirable. Turning the FET switches into a full OFF state results in improved RF linearity in terms of harmonics and Inter Modulation Distortion (IMD), better RF power handling and also higher isolation.

In most applications using such DTC circuit as shown in FIG. 1, a positive supply voltage is readily available externally. However, the negative supply voltage is usually generated on-chip using a bias generator. The bias generator may conventionally use one or more charge pumps and voltage regulators.

On the other hand, there are applications where generating a negative supply voltage is either not desired or not practical due to design constraints. More in particular, in many applications a use of a negative charge pump is not even possible. These are applications with stringent requirements such as extremely low current and power consumption, extremely low noise sensitivity and very small die areas. Moreover, in biasing schemes wherein charge pumps are used to generate negative supply power, the switching speed is limited by current sourcing capability of the charge pumps. This is the main reason charge pumps cannot be used when designing integrated circuits requiring very fast switching times.

Embodiments of the present disclosure offer solutions for integrated circuits comprising DTC's wherein conventional designs to generate a negative supply voltage (e.g. charge pumps) are either impractical or impossible due to stringent system design requirements.

Figure 2A:
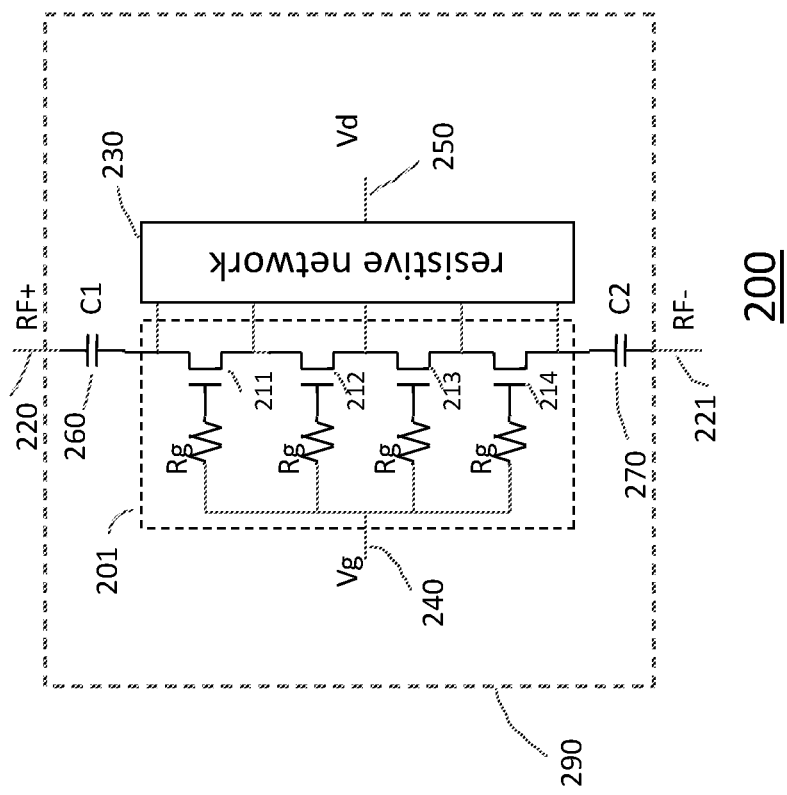
FIGS. 2A-2D show integrated circuit blocks comprising resistive networks in accordance with embodiments of the present disclosure.

FIG. 2A shows an integrated circuit block 200 according to an embodiment of the present disclosure. The integrated circuit block 200 comprises a circuit block 290 coupled to two nodes RF+ (220) and RF− (221). The circuit block 290 comprises a sub-circuit 201 that is analogous to any of the sub-circuits (e.g., 101, 102, . . . and 10$n$) as shown in FIG. 1. The sub-circuit 201 comprises a plurality of stacked FET switches (e.g., FETs 211, 212, 213 and 214). As also shown in FIG. 2A, the circuit block 290 comprises two capacitors C1 (260) and C2 (270) connected in series with the sub-circuit 201. More in particular, the capacitor C1 is close to a top end of the sub-circuit 201 and the capacitor C2 is close to a bottom end of the sub-circuit 201 in accordance with the current embodiment of the present disclosure. In addition to providing desired capacitance values to the DTC, the capacitors C1 and C2 are used for DC isolation purpose in accordance to an embodiment of the present teaching. In other words and from DC stand point, the capacitors C1 and C2 isolate the sub-circuit 201 from the node RF+ (220) and the node RF− (221) respectively.

Referring to FIG. 2A, the integrated circuit block 200 further comprises two supply voltages Vg (240) and Vd (250). In an operative condition, the two supply voltages Vg and Vd are used to enable or disable the switching stacks of FETs. The integrated circuit block 200 shown in FIG. 2 further comprises a resistive network 230. The resistive network 230 comprises a plurality of resistive paths that are used to connect the supply voltage Vd to drains of corresponding FET switches in accordance with an embodiment of the present disclosure. Furthermore, the resistive network 230 provides also a resistive path from the supply voltage Vd to a source terminal of a FET switch that is the closest to the capacitor C2 (e.g., switch FET 214 as shown in FIG. 2). In accordance with an embodiment of the present disclosure, the supply voltages Vg and Vd provide non-negative voltage levels. In other words and as described in more detail below, a combination of the non-negative supply voltages Vd and Vg provides a Positive Logic biasing scheme (they supply either a positive or 0 voltage) wherein a required voltages across a gate-source terminals of FET switches to enable or disable the switch stack is provided and therefore, the capacitance between the nodes 220 and 221 is adjusted. According to a further embodiment of the disclosure, the switch FETs are manufactured symmetrically, meaning that their source and drain can be interchanged without affecting the principal of operations as described in the present teachings.

In what follows, embodiments showing more details of the resistive network (230) will be described.

Figure 2B:
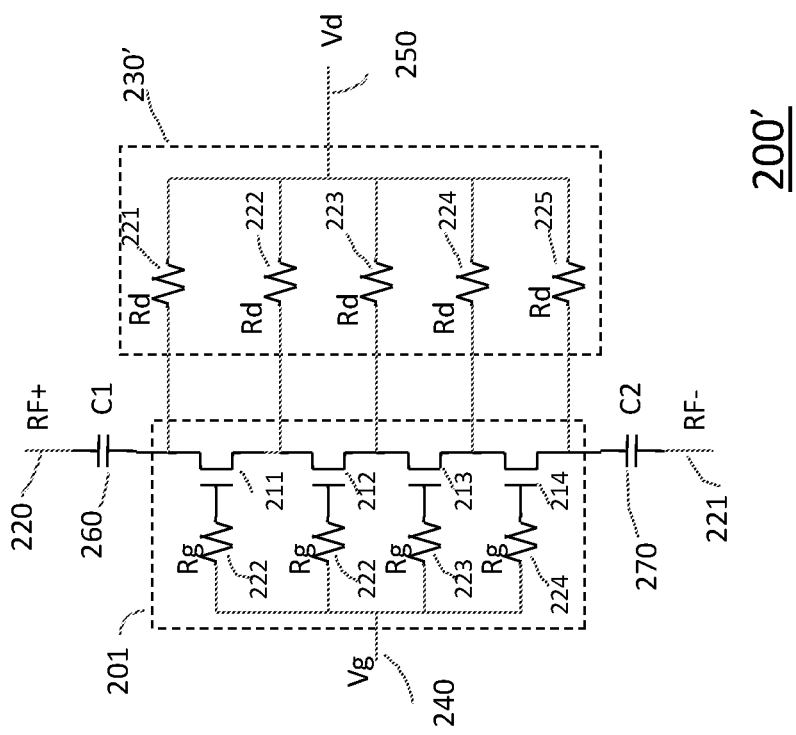

FIG. 2B shows another embodiment of an integrated circuit block 200' made in accordance with the present teachings. The integrated circuit block 200' comprises a resistor network 230' comprising a plurality of resistors Rd (e.g., resistors 221-225). Each resistor Rd connects the non-negative supply voltage Vd to a drain terminal of a corresponding FET in the switch stack. Moreover, a source terminal of the switching FET that is the closest to the capacitor C2 (e.g., FET 214) is connected to the supply voltage Vd through the resistor 224. Also shown in FIG. 2B are gate resistors Rg, each connecting the supply voltage Vg to a corresponding gate terminal of the FET stack.

Further referring to FIG. 2B and by way of example, the FET stacks are turned ON by applying a positive voltage (e.g. +3V) to the FET gates (via Rg's), while applying 0V to the FET drains (via Rd's). This effectively creates a positive DC gate to source voltage Vgs for every FET in the stack (i.e. gate voltage is +3V with respect to the source terminal). Correspondingly, the FET stacks are turned OFF by applying 0V to the FET gates (via Rg's), while applying a positive voltage (e.g. +3V) to the drain (via Rd's). This effectively creates a negative DC Vgs for every FET in the stack (i.e. gate voltage is −3V with respect to source terminal). Note that obtaining a negative voltage Vgs as described in the OFF state, is mainly by virtue of DC blocking provided by the capacitors C1 (260) and C2 (270). In other words, since drain DC voltages across the stack are non-zero in the OFF state, the DC blocking capacitors 260 and 270 are used on both ends of the stack to achieve the required gate-source voltage levels in both ON and OFF states. In the described example, the supply voltages Vg and Vd are inverted versions of each other. In other words, when Vg is high (e.g., +3V) Vd is low (e.g., 0V) and vice versa. Although in an embodiment based on the described example, the supply voltages Vd and Vg are inverted versions of each other, the person skilled in the Art will understand that other embodiments may be envisaged wherein the supply voltages Vd and Vg do not switch at the same time and/or are not inverted versions of each other. In another embodiment of the disclosure, the drain terminals of the switching stack is biased at a fixed voltage. This can be accomplished by providing a constant mid-rail voltage (e.g., +1.5V) as Vd. Similar to the previous example, when Vg is high (e.g., +3V) a positive voltage of +1.5V will appear across the gate-source of each switch FET and the switches are ON, and when Vg is low (e.g., 0V) a negative voltage of −1.5V will appear across the gate-source of each FET switch and as a result, the switch stack will be OFF. In this biasing scheme, lower or higher voltages may also be used (e.g., +0.5V) for Vd. In a further embodiment of the disclosure, the fixed mid-rail voltage may be chosen based on the threshold voltage, Vt, of the FETs to provide the same amount of gate overdrive (Vgs−Vt) in both ON and OFF states. It is emphasized that a negative voltage is not used in the described biasing scheme and therefore design of integrated circuits requiring very fast switching time is made possible through the teaching of the present disclosure. In a design based on the prior art, a conventional method (e.g., charge pump) is required to generate a negative bias and as a result, the integrated circuit speed will be limited to the speed of charge pump when sourcing current. Moreover, in a typical design based on prior art, a supply voltage analogous to the supply voltage Vg of FIG. 2B, needs to be pulled down to 0V, then down to −3V to turn off a corresponding FET switch. However, continuing with the same example, the two supply voltages Vd and Vg may only change by half of a voltage change just described to make the switching happen. In other words, the supply voltage Vg may go from 3V to 0V while the supply voltage Vd may go up simultaneously. This results in a further improvement in switching time compared to typical designs of prior Art as mentioned above, Referring to FIG. 2B, supplying a large level of positive voltage to a gate-source or gate-drain junction when turning the FET switch ON, will reduce the ON resistance, Ron, of the FET switch. This results in lower RF loss. On the other hand, applying a large level of negative voltage to turn OFF the FET switch improves the linearity and harmonics performance of the FETs. These are the main reasons why it is desired to drive the FETs as hard as possible when turning them ON and OFF. In other words, as long as the applied voltages stay safely below the breakdown voltages or safe operating voltages across various terminals of the FET switches, it is preferred to apply the maximum allowable voltage across the gate-source terminals of the switching FETs when enabling and disabling them. In a preferred embodiment, Vd and Vg are chosen so that maximum allowable voltages are applied to the stack to turn the switches ON and OFF. The person skilled in the art will understand that other design choices for Vd and Vg are also possible.

With further reference to FIG. 2B, the person skilled in the art will appreciate that, regardless of the switching stack state and except for the FETs' leakage currents, the integrated circuit block 200' and the generation of the bias voltages does not consume any DC power. This is very beneficial for integrated circuits with stringent power or current consumption requirements. A preferred embodiment of the present disclosure uses the existing supply rail to provide Vd and Vg. However, the person skilled in the art will understand that other design choices to provide Vd and Vg may be envisaged.

Although in the preferred embodiment of FIG. 2B the gate resistors Rg are equal in size and the drain resistors Rd are all equal in size, the person skilled in the art will understand that other embodiments may comprise gate resistors and drain resistors of different sizes. Similarly, the capacitors C1 and C2 may have same or different capacitances as used in various embodiments of the present disclosure. Although in a preferred embodiment of the disclosure, a bias voltage is applied evenly to every drain terminal in the FET stack, the person skilled in the art will also understand that other implementations applying uneven bias voltages to drain terminals of the switching FETs may also be envisaged. Referring to FIG. 2B, a function of the resistors Rd and Rg is to isolate the RF signal from the DC circuitry. The size of the resistors Rg and Rd are desired to be as large as possible as long as switching requirements and die area constraints are met. These resistors de-Q (lower the Q) the capacitance of switching FETs when the switch is OFF, and de-Q the capacitors C1 and C2 in both states and therefore a larger size is preferred to achieve a higher Q for the DTC Referring to the embodiments disclosed in the present disclosure, all the design rules, guidelines as well as the related tradeoffs as disclosed in the PCT Patent International Application No. PCT/US2009/001358 filed Mar. 2, 2009, entitled "Method and Apparatus for use in Digitally Tuning a Capacitor in an Integrated Circuit Device" incorporated herein by reference in its entirety, remain applicable to the embodiments described herein with reference to the present disclosure. By way of example, the ON resistance, OFF capacitance, stack height, capacitor values, Rg and Rd values may be appropriately selected using the teachings as disclosed in the above-incorporated patents. Additionally, the person skilled in the art will understand that, after minor modifications and proper adjustments, all the equations as described in the above-incorporated patent will be applicable to the embodiments of the present disclosure.

Figure 2C:
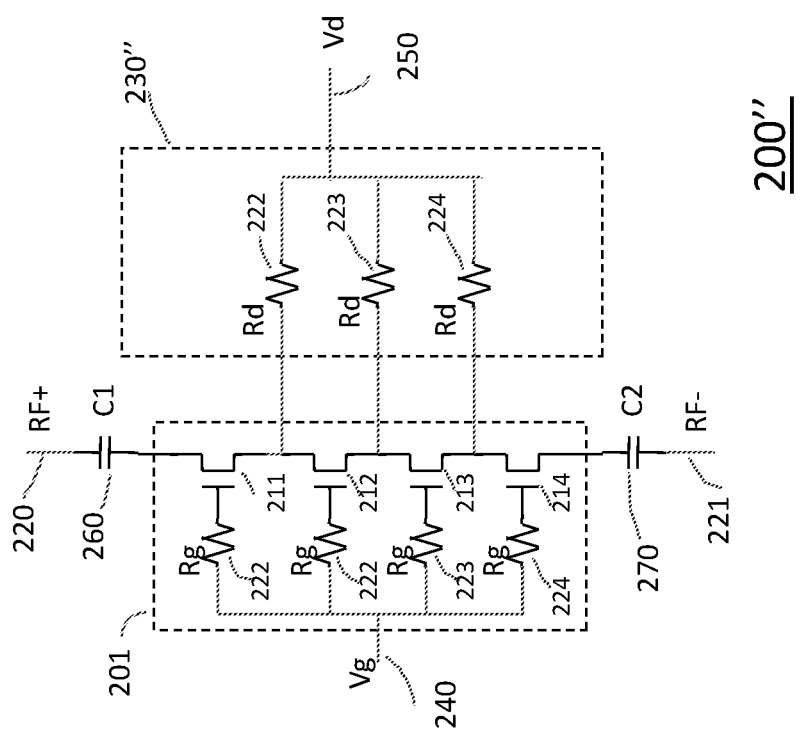

Further referring to FIG. 2B, embodiments in accordance with the disclosure wherein the supply voltage is connected to the drains or sources of only some of the FET switches (and not all) are also possible. For example, FIG. 2C shows an integrated circuit block 200" in accordance with another embodiment of the disclosure. The resistive network 230" is similar to the resistive network 230' with an exception that the supply voltage is neither connected to the drain terminal of the switch on the top end of the stack nor to the source terminal of the switch on the bottom end of the stack. The principal of operation of the integrated circuit block 230" remains the same as that of the integrated circuit block 230' shown in FIG. 2B.

Figure 2D:
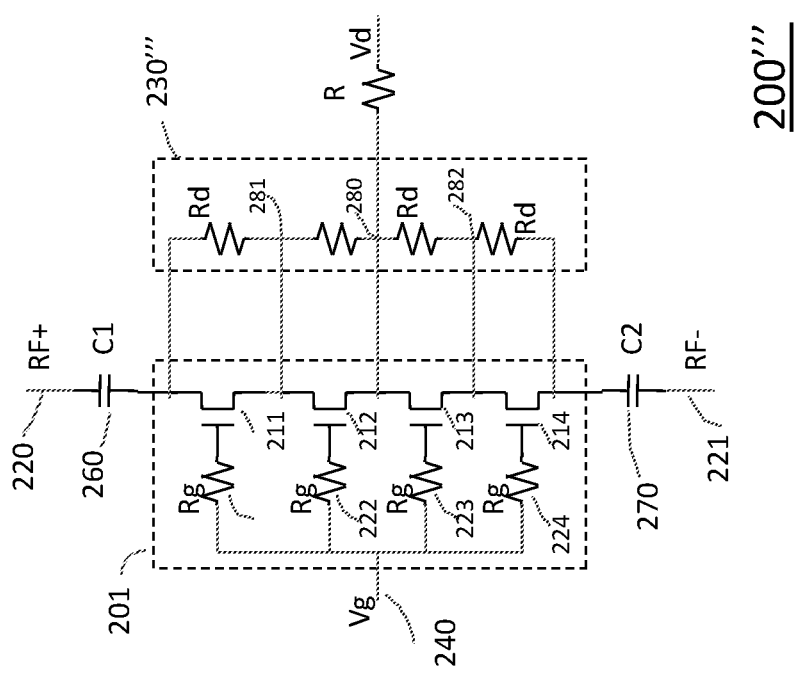

FIG. 2D shows an integrated circuit block 200''' according to a further embodiment of the present disclosure. Also shown in FIG. 2D is a resistive network 230''' comprising a plurality of resistors Rd, connected across the drain-source terminals of a corresponding switching FET. The supply voltage Vd is coupled to a node 280 of the resistive network 230" through a series resistance R, thereby providing bias voltages to the drain terminals of the stack switch. The person skilled in the art will understand that the supply voltage Vd may be connected to a different node of the resistive network 230" (for example node 281 or node 282).

Figure 3:
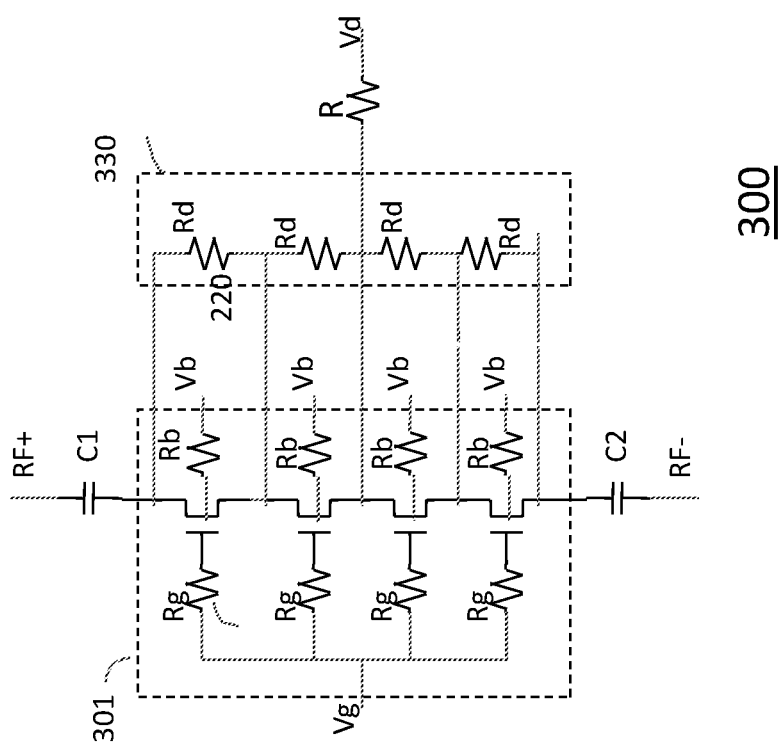
FIG. 3 shows an embodiment of the present disclosure using four terminal FET switches.

FIG. 3 shows an integrated circuit block 300 according to an embodiment of the disclosure. The DTC circuit 300 comprises a plurality of stacked four-terminal FET switches. As shown in FIG. 3, bodies of the plurality of the stacked four terminal FET switches are connected to a plurality of bias voltages Vb using a plurality of resistances Rb. In an embodiment of the disclosure, when the stack switch is in an OFF state, Vb=Vg=0V and Vd=+3V and when the switches are ON, Vb=Vd=0V and Vg=+3V. In accordance with another embodiment of the present disclosure, when the switches are OFF Vb=Vg=0V, Vd=+1.5V and in an ON state Vb=Vd=0V and Vg=+1.5V.

Figure 4A:
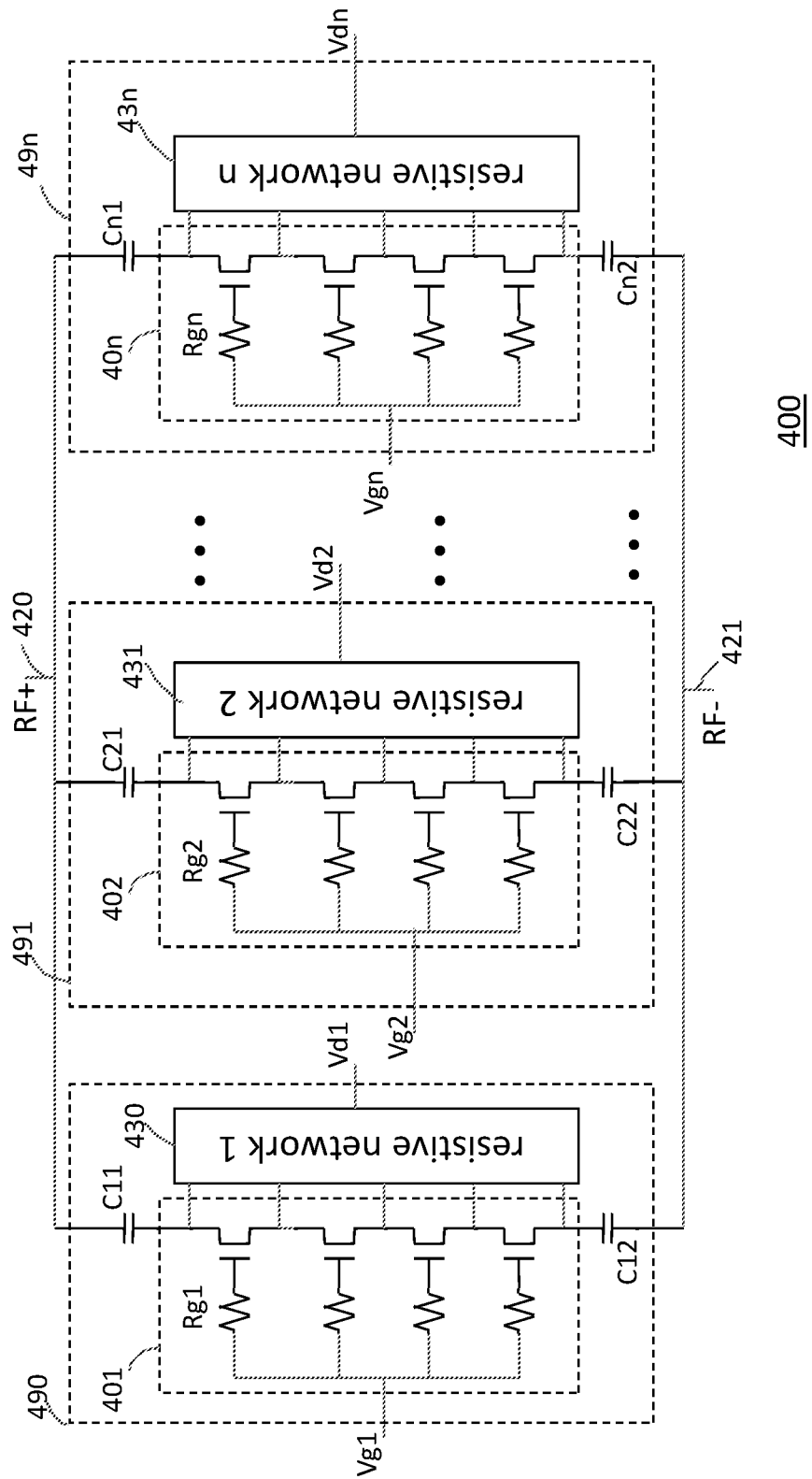
FIGS. 4A-4C show DTC circuits comprising resistive networks in accordance with additional embodiments of the present disclosure.

Turning back to the depiction of FIG. 2A, embodiments of the present disclosure may be made using a plurality of the circuit blocks 290 configured in parallel and in accordance of the teachings as disclosed in the PCT Patent International Application No. PCT/US2009/001358 filed Mar. 2, 2009, entitled "Method and Apparatus for use in Digitally Tuning a Capacitor in an Integrated Circuit Device" incorporated herein in its entirety. In what follows, examples of such implementations will be discussed. FIG. 4A shows an example where a DTC 400 is made in accordance with an embodiment of the disclosure and using the teachings of the above-incorporated patent documents. The DTC circuit 400 comprises a plurality of circuit blocks (e.g., circuit blocks 490, 491, . . . and 49n) configured in parallel and coupled to two nodes RF+ (420) and RF− (421). The DTC circuit 400 further comprises a first plurality of supply voltages (e.g., Vg1, Vg2, . . . and Vgn), a second plurality of supply voltages (e.g., Vd1, Vd2, . . . and Vdn). Each circuit block comprises a plurality of stacked FET switches (e.g., stacked FET switches 401, 402, . . . and 40n) coupled in series with a first capacitor having a terminal connected to the node 420 (e.g., capacitors C11, C21, . . . and Cn1) and a second capacitor having a terminal connected to the node 421 (e.g., capacitors C12, C22, . . . and Cn2). Each stacked FET switch comprises a plurality of gate resistors (e.g., Rg) having first terminals coupled to gates of corresponding FETs and second terminals coupled to a corresponding supply voltage of the first plurality of supply voltages (e.g., Vg1, Vg2, . . . and Vgn). The plurality of circuit blocks further comprises a plurality of resistive networks (e.g., resistive networks 430, 431, . . . and 43n). Each resistive network is fed by a corresponding supply voltage of the second plurality of supply voltages (e.g., Vd1, Vd2, . . . and Vdn). Each resistive network is further coupled to drains of corresponding stacked FET switches and a source of the corresponding FET switch located at a bottom end of the corresponding stacked FET switches. Various implementations according to the methods disclosed in the above-incorporated patents may be used to come up with different embodiments of the disclosure. By way of example, weighting schemes in accordance with a binary code, thermometer code, a combination of the two or any other convenient and useful code may be envisaged.

Referring to FIG. 4A, in a preferred embodiment according to the present disclosure, the two capacitors in each circuit block have equal capacitance (e.g., C11 capacitance is equal to C12 capacitance, C21 capacitance is equal to C22 capacitance, . . . and Cn1 capacitance is equal to Cn2 capacitance). However, the person skilled in art will understand that embodiments wherein capacitances have all different values are also possible.

With further reference to FIG. 4A, although a preferred embodiment would comprise a plurality of same resistive networks in accordance with the present teaching, the person skilled in the art will also understand that other embodiments involving different types of resistive networks may also be made. In another preferred embodiment of the disclosure, the plurality of the circuit blocks would comprise a same number of switching FETs in their respective sub-circuits. However, a person skilled in the art will also appreciate that other embodiments may comprise a plurality of circuit blocks comprising each a different number of switching FETs. Generally speaking, the supply voltages as shown in FIG. 4A may all supply different voltage levels in some embodiment of the disclosure. However, a preferred embodiment in accordance with the present teachings may comprise a first plurality of supply voltages Vg1, Vg2, . . . and Vgn of same levels as well as a second plurality of supply voltages Vd1, Vd2, . . . and Vdn supplying equal voltage levels.

With continuous reference to FIG. 4A, in an embodiment according to the present disclosure, DC voltages on the nodes 420 and 421 are arbitrary and independent from the supply voltages Vg1, Vg2, . . . and Vgn, Vd1, Vd2, . . . and Vdn.

Figure 4B:
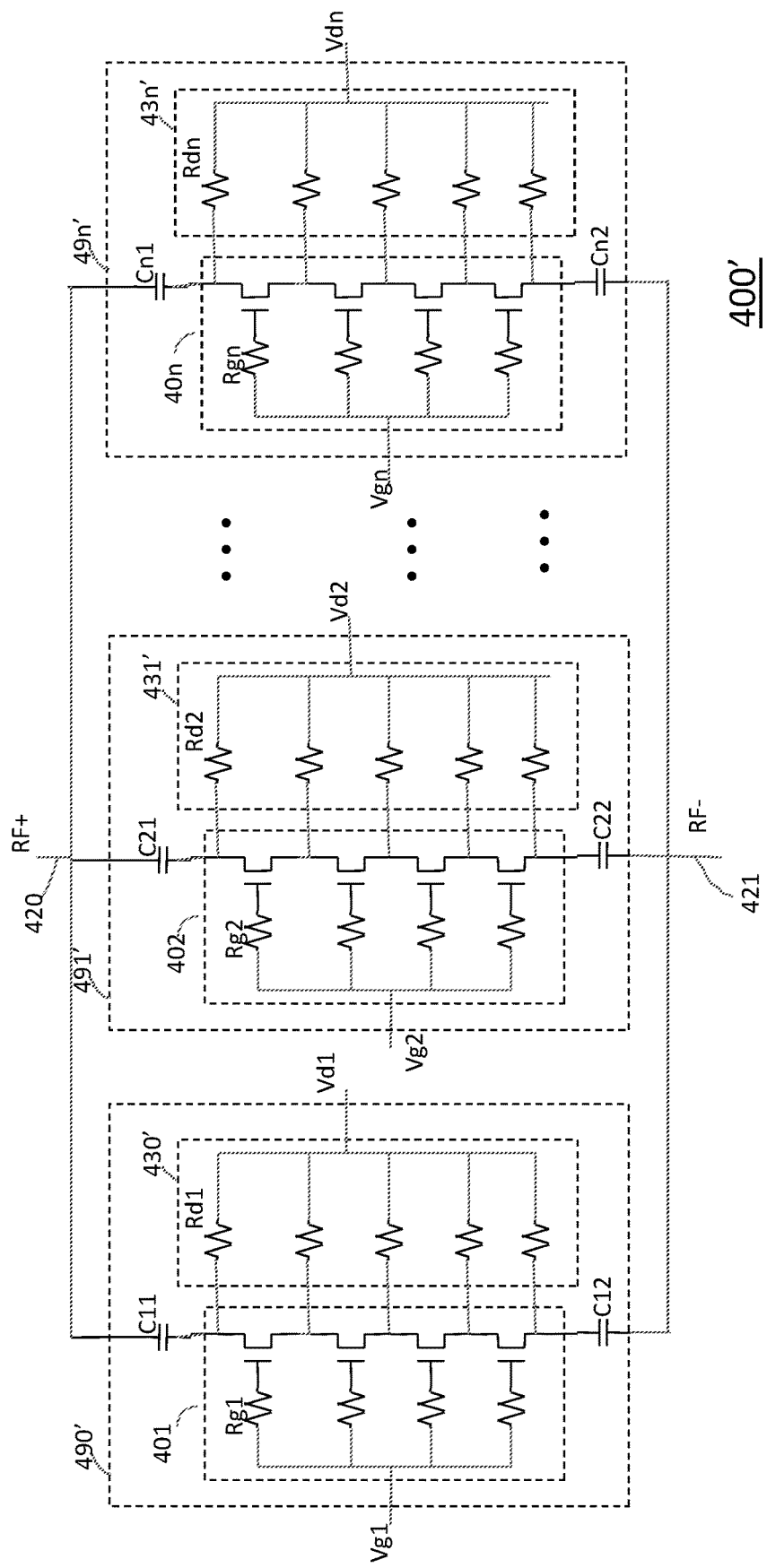

FIG. 4B shows a DTC circuit 400' according to an embodiment of the present disclosure. The DTC circuit 400' comprises a plurality of resistive networks (e.g., resistive networks 430', 431', . . . and 43n'). Each resistive network comprises a plurality of resistors having first terminals coupled to drains of corresponding FETs and second terminals coupled to the corresponding supply voltage of the plurality of second supply voltages (e.g., Vd1, Vd2, . . . and Vdn). Each resistive network further comprises a last resistor having a first terminal coupled to the corresponding supply voltage of the plurality of second supply voltages (e.g., Vd1, Vd2, . . . and Vdn) and a second terminal coupled with a source of the corresponding FET switch located at the bottom end of the corresponding stacked FET switches.

Figure 4C:
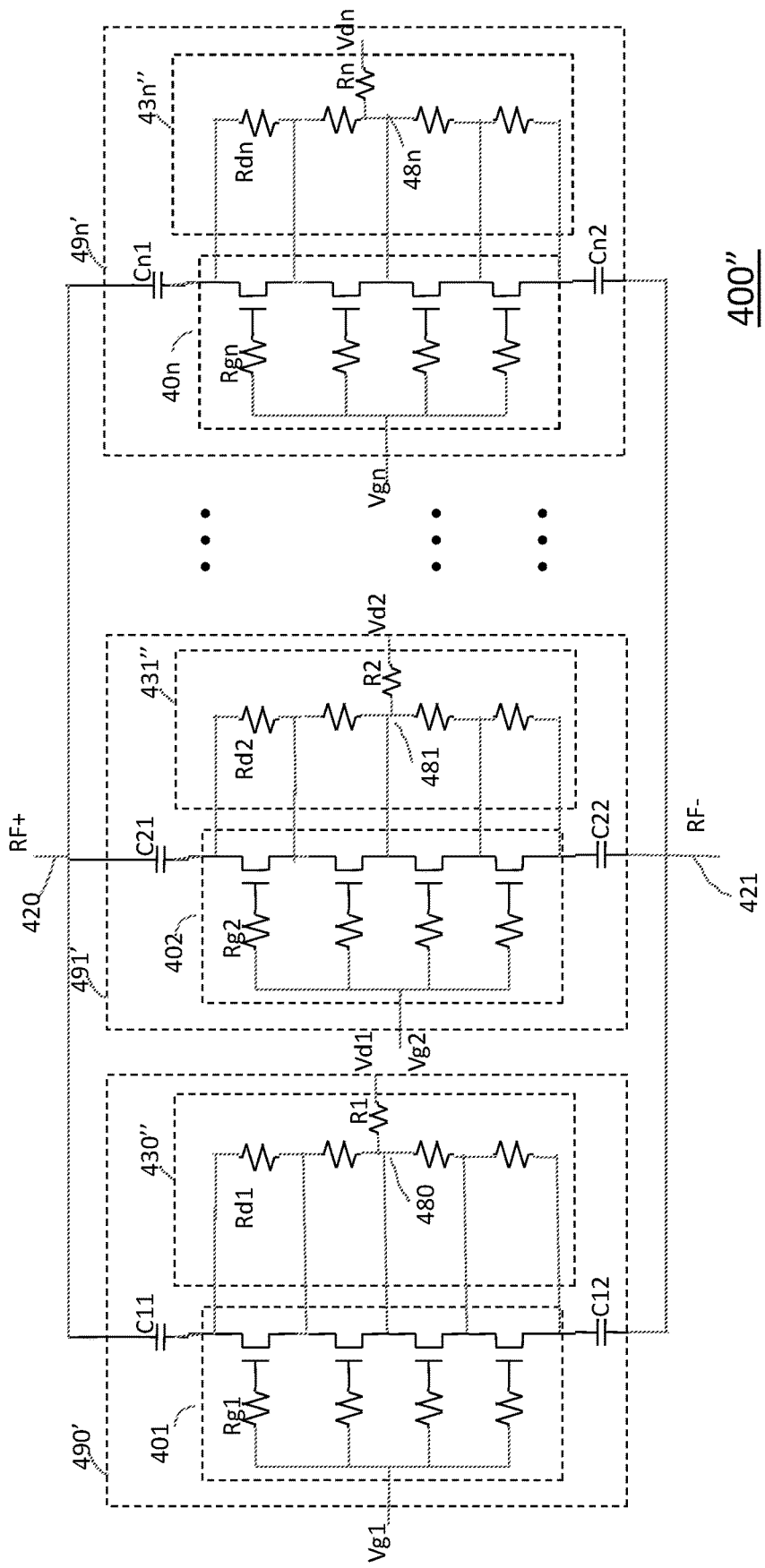

FIG. 4C shows a DTC circuit 400" in accordance with another embodiment of the present disclosure. The DTC circuit 400' comprises a plurality of resistive networks (e.g., resistive networks 430", 431", . . . and 43n"). Each resistive network comprises a plurality of resistors coupled across drains and sources of corresponding stacked FET switches. Furthermore, each resistive network is fed by a corresponding supply voltage of the second plurality of supply voltages through a series resistor of the resistive network (e.g., R1, R2, . . . and Rn).

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

Fabrication Technologies and Options

Although most embodiments described in the present disclosure use MOSFET devices, the person skilled in the art will understand that embodiments implementing the teachings of the disclosure may be envisaged wherein a device comprising three or more terminals is used. Such device further comprises a resistance between two terminals wherein the resistance is controlled by a third terminal.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits. Further, as should be readily apparent to one of ordinary skill in the art, various embodiments of the invention may take into account the RF characteristics (e.g., distributed effects) of various components and may include additional circuit elements to adjust or compensate for such characteristics. For example, at high radio frequencies, a pure resistor cannot be readily implemented in actual ICs—an actual resistor will have some physical length which introduces effects other than resistance alone, such as parasitic capacitance and/or inductance. Similarly, actual inductive and capacitive elements may include a resistive characteristic and also exhibit distributed effects on other components. Accordingly, where resistive R, capacitive C, and inductive L components have been specified above, it should be understood that such components may be implemented by elements that are substantially resistive, substantially capacitive, and substantially inductive, respectively.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. An integrated circuit block comprising:
   a first node;
   a second node;
   a resistive network;
   a series arrangement of two or more capacitors and a plurality of FET switches coupled between the first node and the second node; and
   supply rails providing a first supply voltage and a second supply voltage;
   wherein:
   a first capacitor of the two or more capacitors is coupled to the first node and a second capacitor of the two or more capacitors is coupled to the second node;
   the plurality of FET switches comprises a first end FET switch and a second end FET switch, the first end FET switch being closest to the first node and farthest from the second node and the second end FET switch being closest to the second node and farthest from the first node;
   each FET switch comprises a gate resistor connecting a FET switch gate to the first supply voltage; the resistive network comprises a plurality of resistive paths connecting the second supply voltage to drains of corresponding FET switches;
   the first supply voltage and the second supply voltage are non-negative supply voltages configured to enable or disable the FET switches and thereby adjusting the capacitance between the two nodes;
   the second supply voltage is a constant mid-rail voltage based on a threshold voltage of the plurality of FET switches; and
   the first supply voltage and the second supply voltage are independent of a number of FET switches of the plurality of the FET switches.

2. The integrated circuit block of claim 1, wherein the resistive network comprises a plurality of resistors, the plurality of resistors having first terminals connected to drains of corresponding FET switches and second terminals connected to the second supply voltage; the resistive network further comprising an end resistor, the end resistor connecting the source of the second end FET switch to the second supply voltage.

3. The integrated circuit block of claim 2, wherein the plurality of resistors has same resistances.

4. A digitally tunable capacitor circuit comprising:
   a plurality of integrated circuit blocks of claim 3, wherein the plurality of integrated circuits are configured in parallel.

5. A digitally tunable capacitor circuit comprising:
   a plurality of integrated circuit blocks of claim 2, wherein the plurality of integrated circuits are configured in parallel.

6. The integrated circuit block of claim 1, wherein the plurality of FET switches comprises two or more FET switches configured to withstand a voltage greater than a voltage withstood by one switch.

7. A digitally tunable capacitor circuit comprising:
   a plurality of integrated circuit blocks of claim 6, wherein the plurality of integrated circuits are configured in parallel.

8. The integrated circuit block of claim 1, wherein the two or more capacitors have same capacitances.

9. The integrated circuit block of claim 1, wherein the first supply voltage and the second supply voltage are configured to provide a maximum allowable voltage level across gate-source terminals of the FET switches.

10. A digitally tunable capacitor circuit comprising:
    a plurality of integrated circuit blocks of claim 1, wherein the plurality of integrated circuits are configured in parallel.

11. The integrated circuit block of claim 1, further comprising a resistive path connecting the second supply voltage to a source of the second end FET switch.

12. A method of digitally tuning a capacitor in an integrated circuit, the method comprising the steps of:
    providing a first node;
    providing a second node;
    providing a series arrangement of two or more capacitors and a plurality of FET switches; the plurality of FET switches comprising a first end FET switch and a second end FET switch, the first end FET switch being the closest to the first node and farthest from the second node and the second end FET switch being closest to the second node and farthest from the first node, and each of the plurality of FET switches comprising a gate resistor;
    providing a non-negative second supply voltage via a constant mid-rail voltage based on a threshold voltage of the plurality of FET switches, wherein the non-negative second supply voltage is independent of a number of FET switches of the plurality of FET switches;

providing a resistive network, the resistive network comprising:
- a plurality of resistive paths connecting the second supply voltage to drains of corresponding FET switches of the plurality of FET switches;
- a resistive path connecting the second supply voltage to a source of the second end FET switch;

providing a non-negative first supply voltage independent of a number of FET switches of the plurality of FET switches;

connecting each of the FET switches from the plurality of the FET switches to the first supply voltage via a corresponding gate resistor;

coupling the series arrangement of two or more capacitors and the plurality of FET switches between the first node and the second node;

coupling a first capacitor of the two or more capacitors to the first node and coupling a second capacitor of the two or more capacitors to the second node; and enabling or disabling the FET switches using the first supply voltage and the second supply voltage and thereby adjusting the capacitance between the two nodes.

\* \* \* \* \*